(12) United States Patent
Saito

(10) Patent No.: US 7,547,934 B2
(45) Date of Patent: Jun. 16, 2009

(54) MAGNETO-RESISTIVE EFFECT ELEMENT AND MAGNETIC MEMORY

(75) Inventor: Yoshiaki Saito, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/862,966

(22) Filed: Sep. 27, 2007

(65) Prior Publication Data

US 2008/0019058 A1    Jan. 24, 2008

Related U.S. Application Data

(62) Division of application No. 10/886,547, filed on Jul. 9, 2004, now Pat. No. 7,307,302.

(30) Foreign Application Priority Data

Jul. 9, 2003    (JP)    ............................. 2003-194513

(51) Int. Cl.
*H01L 27/108* (2006.01)
(52) U.S. Cl. ..................... 257/295; 257/296; 257/422
(58) Field of Classification Search .................. 257/295, 257/296, 422
See application file for complete search history.

(56) References Cited

U.S. PATENT DOCUMENTS

| 5,953,248 | A  | 9/1999  | Chen et al. |
| 6,833,982 | B2 | 12/2004 | Jayasekara |
| 6,845,038 | B1 | 1/2005  | Shukh |
| 6,853,580 | B2 | 2/2005  | Nishimura |

FOREIGN PATENT DOCUMENTS

| JP | 08-321016    | 12/1996 |
| JP | 11-213650    | 8/1999  |
| JP | 2000076843   | 3/2000  |
| JP | 2000-307170  | 11/2000 |
| JP | 2001-273760  | 10/2001 |
| JP | 2002-025013  | 1/2002  |
| JP | 2002-074937  | 3/2002  |
| JP | 2002-289946  | 10/2002 |

*Primary Examiner*—Douglas M Menz
(74) *Attorney, Agent, or Firm*—Oblon, Spivak, McClelland, Maier & Neustadt, P.C.

(57) ABSTRACT

It is possible to obtain excellent heat stability even though the element is miniaturized and keep stable magnetic domains even though switching is repeated any number of times. A magneto-resistive effect element includes: a magnetization-pinned layer including a magnetic film having a spin moment oriented in a direction perpendicular to a film surface thereof and pinned in the direction; a magnetic recording layer having a spin moment oriented in a direction perpendicular to a film surface thereof; a nonmagnetic layer formed between the magnetization-pinned layer and the magnetic recording layer; and an anti-ferromagnetic film formed on at least side surfaces of the magnetization-pinned layer.

14 Claims, 19 Drawing Sheets

MAGNETO-RESISTIVE EFFECT ELEMENT AND MAGNETIC MEMORY

CROSS REFERENCE TO RELATED APPLICATIONS AND INCORPORATION BY REFERENCE

This application is a divisional of and claims the benefit of priority under 35 USC §120 from U.S. Ser. No. 10/886,547, filed Jul. 9, 2004 and is based upon and claims the benefit of priority under 35 USC §119 from the Japanese Patent Applications No. 2003-194513, filed on Jul. 9, 2003 the entire contents of both of which are incorporated herein by reference.

BACKGROUND OF THE INVENTION

1. Field of the Invention

The present invention relates to a magneto-resistive effect element and a magnetic memory.

2. Related Art

A magneto-resistive effect element having magnetic films is used for a magnetic head, a magnetic sensor and so forth, and it has been proposed to be used for a solid magnetic memory. In particular, there is an increasing interest in a magnetic random access memory (hereinafter, referred to as "MRAM (Magnetic Random Access Memory)), which utilizes the magneto-resistive effect of ferromagnetic material, as a next generation solid non-volatile memory capable of carrying out a rapid reading/writing and an operation with large capacity and low power consumption.

In recent years, a ferromagnetic tunnel junction element or the so-called "tunneling magneto-resistive element (TMR element)" has been proposed as a magneto-resistive effect element utilizing a tunnel current and having a sandwiching structure where one dielectric is inserted between two ferromagnetic metal layers, and a current is caused to flow perpendicular to a film face to utilize a tunneling current. In the tunneling magneto-resistive element, since a magneto-resistance change ratio (MR ratio) has reached 20% or more, a possibility of the MRAM to public application is increasing.

The TMR element is realized by the following method. That is, after a thin AL (aluminum) layer having a thickness of 0.6 nm to 2.0 nm is formed on a ferromagnetic electrode, and the surface of the Al layer is exposed to oxygen glow discharge or an oxygen gas to form a tunnel barrier layer consisting of $Al_2O_3$.

Further, a ferromagnetic single tunnel junction having a structure where a magnetization direction of one of ferromagnetic layers constituting the ferromagnetic single tunnel junction is pinned by an anti-ferromagnetic layer has been proposed.

Further a ferromagnetic tunnel junction obtained through magnetic particles diffused in a dielectric material and a ferromagnetic dual tunnel junction have been also proposed.

In view of the fact that a magneto-resistance change ratio in a range of 20% to 50% have been also achieved in these tunneling magneto-resistive elements and the fact that reduction in magneto-resistance change ratio can be suppressed even if a voltage value to be applied to a tunneling magneto-resistive element is increased in order to obtain a desired output voltage value, there is a possibility of the TMR element to application to the MRAM.

When the TMR element is used in the MRAM, one of the two ferromagnetic layers interposing the tunnel barrier layer, i.e., a magnetization-pinned layer whose magnetization direction is pinned so as to not change is defined as a magnetization reference layer, and the other thereof, i.e., a magnetization free layer whose magnetization direction is easily allowed to be inverted is defined as a storage layer. A state in which the magnetization directions in the reference layer and the storage layer are parallel to each other and a state in which the directions are antiparallel to each other are assigned to pieces of binary information "0" and "1", respectively, so that information can be stored.

Recording information is written by inverting the magnetization direction in the storage layer by an induced magnetic field generated by flowing a current in a write wiring arranged near the TMR element. The recording information is read by detecting a change in resistance caused by a TMR effect.

A magnetic recording element using the ferromagnetic single tunnel junction or the ferromagnetic dual tunnel junction is nonvolatile and has a short write/read time of 10 ns or less and potential, i.e., can be rewritten $10^{15}$ or more. In particular, in a magnetic recording element using a ferromagnetic dual tunnel junction, as described above, a decrease in magneto-resistance change ratio can be suppressed even though a voltage applied to the ferromagnetic tunnel junction element is increased to obtain a desired large output voltage, and preferable characteristic for a magnetic recording element can be achieved.

However, regarding a cell size of the memory, when an architecture where a cell is constituted by one transistor and one TMR element is used, it is disadvantageously impossible to make a memory cell size smaller than the size of a semiconductor DRAM (Dynamic Random Access Memory).

In order to solve the above problem, a diode architecture in which a TMR element and a diode are serially connected between a bit line and a word line and a simple matrix architecture in which a TMR element is arranged between a bit line and a word line are proposed.

However, when a design rule is set at 0.18 μm or less, the following problem is posed. That is, a magnetic material cannot keep heat stability due to the influence of heat disturbances to make impossible to keep nonvolatile properties. In addition, when magnetization switching of the magnetization free layer is repeated several times in the TMR element having a design rule of 0.18 μm or more, the magnetization free layer has a plurality of magnetic domains. Bits of the plurality of magnetic domains have extremely poor thermal stability.

In order to solve these problems, it is proposed that a plurality of magnetization free layers are provided in a magneto-resistive effect element or a perpendicular-magnetization material is used in as the material of the magneto-resistive effect element.

When a magneto-resistive effect element (for example, see the specification of U.S. Pat. No. 5,953,248) having a plurality of magnetization free layers is used, the heat stability of the magnetization free layers is kept until the design rule is about 0.09 μm. However, the magneto-resistive effect element is miniaturized to have a design rule smaller than 0.09 μm, the problem of heat disturbances also becomes conspicuous.

When the perpendicular-magnetization material is used (for example, see Japanese Patent Laid-Open Publication No. 11-213650), the volumes of the magnetization free layer and the magnetization-pinned layer can be increased in the direction of perpendicular magnetization. For this reason, the problems of heat stability and heat disturbances can be solved. Further miniaturizing can be achieved.

However, when a perpendicular-magnetization material is used as a magnetic material, a magneto-resistive effect element that can achieve a preferable exchange coupling between anti-ferromagnetic layer and ferromagnetic layer is unknown up to now.

When a parallel-magnetization material is used as a magnetic material, a TMR element that can achieve a preferable magnetic coupling between anti-ferromagnetic layer and ferromagnetic layer is known. For example, in a TMR element that includes an underlying electrode, an anti-ferromagnetic layer, a magnetization-pinned layer having a ferromagnetic layer, a tunnel barrier layer, a magnetization free layer and a cap layer, and in that the magnetization-pinned layer and the magnetization free layer have in-plane magnetizations, respectively, a laminated structure constituted by the magnetization-pinned layer having the ferromagnetic layer and the anti-ferromagnetic layer is used. For this reason, a preferable exchange coupling between the anti-ferromagnetic layer and the ferromagnetic layer can be achieved.

However, even though the laminated structure constituted by the magnetization-pinned layer having the ferromagnetic layer and the anti-ferromagnetic layer is simply applied to the TMR element made of a material which is shown in Japanese Patent Laid-Open Publication No. 11-213650 and which can be perpendicularly magnetized, a preferable exchange coupling between the anti-ferromagnetic layer and the ferromagnetic layer cannot be achieved.

For this reason, even though a perpendicular magnetization material such as a Co—Cr—Pt alloy having high coercive force is used as the magnetization material of the magnetization-pinned layer, when switching of the magnetization of the magnetization free layer is repeated, the magnetization of the magnetization-pinned layer vary due to the influence of a leakage magnetic field of the magnetization free layer and an Orange Peal coupling to form a plurality of magnetic domains. As a result, a magneto-resistance change ratio decreases.

As described above, a magneto-resistive effect element that has excellent heat stability even though the element is miniaturized and that can keep stable magnetic domains even though switching is repeated any number of times must be realized.

SUMMARY OF THE INVENTION

The present invention has been made on the basis of recognition of the above problems, and has as its object to provide a magneto-resistive effect element that has excellent heat stability even though the element is miniaturized and that can keep stable magnetic domains even though switching is repeated any number of times, and a magnetic memory having the magneto-resistive effect element in a memory cell.

A magneto-resistive effect element according to a first aspect of the present invention includes: a magnetization-pinned layer including a magnetic film having a spin moment oriented in a direction perpendicular to a film surface thereof and pinned in the direction; a magnetic recording layer having a spin moment oriented in a direction perpendicular to a film surface thereof; a nonmagnetic layer formed between the magnetization-pinned layer and the magnetic recording layer; and an anti-ferromagnetic film formed on at least side surfaces of the magnetization-pinned layer.

A magnetic memory according to a second aspect of the present invention includes at least a memory cell, the memory cell including a magneto-resistive effect element as a memory element, the magneto-resistive effect element includes: a magnetization-pinned layer comprising a magnetic film having a spin moment oriented in a direction perpendicular to a film surface thereof and pinned in the direction; a magnetic recording layer having a spin moment oriented in a direction perpendicular to a film surface thereof; a nonmagnetic layer formed between the magnetization-pinned layer and the magnetic recording layer; and an anti-ferromagnetic film formed on at least the side surfaces of the magnetization-pinned layer.

A magnetic memory according to a third aspect of the present invention includes: a first wiring; a second wiring crossing the first wiring; and a magneto-resistive effect element arranged in a crossing area between the first wiring and the second wiring, having one end electrically connected to the first wiring, and including a magnetization-pinned layer comprising a magnetic film having a spin moment oriented in a direction perpendicular to a film surface thereof and pinned in the direction; a magnetic recording layer having a spin moment oriented in a direction perpendicular to a film surface thereof; a nonmagnetic layer formed between the magnetization-pinned layer and the magnetic recording layer; and an anti-ferromagnetic film formed on at least the side surfaces of the magnetization-pinned layer.

DETAILED DESCRIPTION OF THE INVENTION

Embodiments of the present invention will be described below with reference to the accompanying drawings.

FIRST EMBODIMENT

Figure 1:
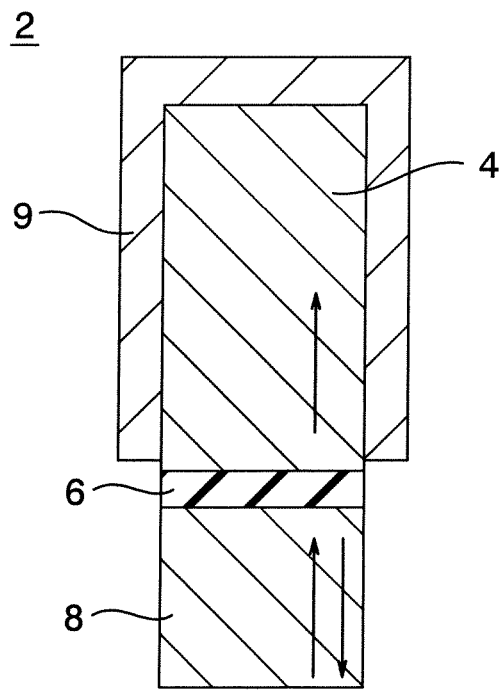
FIG. 1 is a sectional view showing a constitution of a magneto-resistive effect element according to a first embodiment of the present invention.

A constitution of a magneto-resistive effect element according to a first embodiment of the present invention is shown in FIG. 1. The magneto-resistive effect element 2 according to this embodiment is a TMR element, and comprises a magnetization-pinned layer (to be also referred to as a pinned layer hereinafter) 4 having a perpendicular spin moment, a magnetization free layer (to be also referred to as a free layer hereinafter) 8 having a perpendicular spin moment and serving as a magnetic recording layer, a tunnel barrier layer 6 provided between the magnetization-pinned layer 4 and the magnetization free layer 8, and an anti-ferromagnetic film 9 covering side surfaces of the magnetization-pinned layer 4 and a surface of the magnetization-pinned layer 4 opposing the tunnel barrier layer 6.

In this manner, in the magneto-resistive effect element according to the embodiment, the anti-ferromagnetic film 9 is formed on at least side surfaces of the magnetization-pinned layer 4. Therefore, even though the magneto-resistive effect element is miniaturized, the direction of the spin moment of the magnetization-pinned layer 4 is perpendicularly oriented by an exchange coupling between the magnetization-pinned layer 4 and the anti-ferromagnetic film 9. Even though switching of magnetic fields is repeated, the magnetization direction of the magnetization-pinned layer 4 does not vary. Therefore, the magnetization of the magnetization-pinned layer 4 can be kept stable without becoming a plurality of magnetic domains, and the magneto-resistance change ratio can be prevented from being reduced.

SECOND EMBODIMENT

Figure 2:
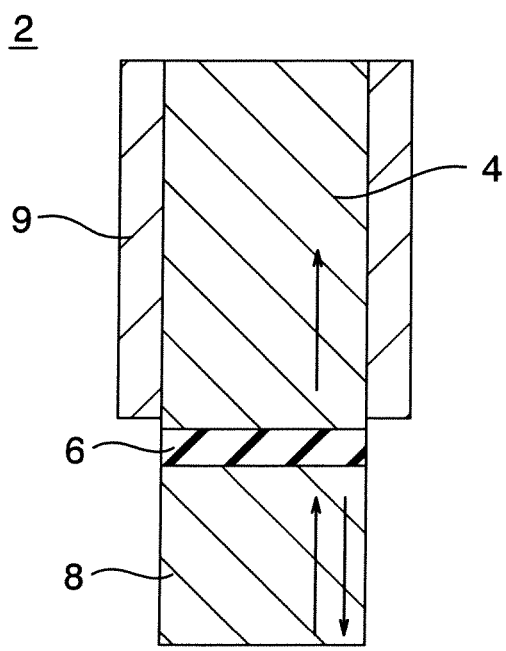
FIG. 2 is a sectional view showing a constitution of a magneto-resistive effect element according to a second embodiment of the present invention.

A constitution of a magneto-resistive effect element according to a second embodiment of the present invention is shown in FIG. 2. The magneto-resistive effect element 2 according to the embodiment has a constitution obtained by removing the anti-ferromagnetic film 9 on the surface of the magnetization-pinned layer 4 opposing the tunnel barrier layer 6 from the magneto-resistive effect element 2 according to the first embodiment shown in FIG. 1, i.e., forming the anti-ferromagnetic film 9 only on the side surfaces of the magnetization-pinned layer 4.

For this reason, even though the magneto-resistive effect element is miniaturized, the spin moment direction of the magnetization-pinned layer 4 is perpendicularly oriented by exchange coupling between the anti-ferromagnetic film 9 and the magnetization-pinned layer 4. Even though switching of the magnetic fields is repeated, the magnetic domain of the magnetization-pinned layer 4 does not vary. Therefore, the magnetization of the magnetization-pinned layer 4 can be kept stable without becoming a plurality of magnetic domains, and the magneto-resistance change ratio can be prevented from being reduced.

THIRD EMBODIMENT

Figure 3:
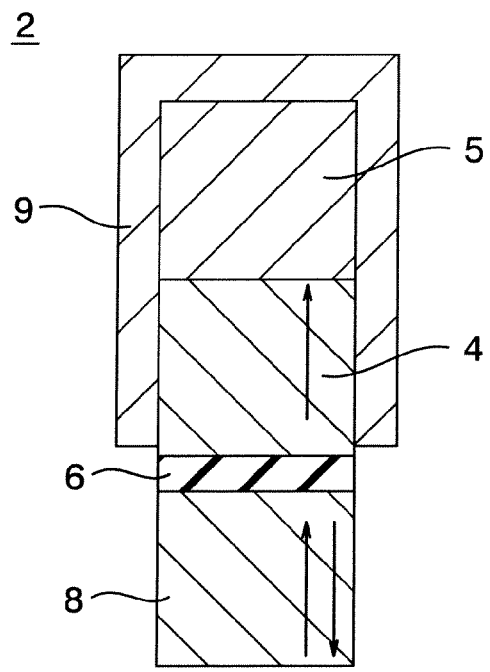
FIG. 3 is a sectional view showing a constitution of a magneto-resistive effect element according to a third embodiment of the present invention.

A constitution of a magneto-resistive effect element according to a third embodiment of the present invention is shown in FIG. 3. The magneto-resistive effect element 2 according to the embodiment has a constitution obtained by forming a nonmagnetic conductive layer 5 on the upper surface of the magnetization-pinned layer 4 in the magneto-resistive effect element 2 according to the first embodiment shown in FIG. 1.

In the magneto-resistive effect element according to the embodiment, the anti-ferromagnetic film 9 is formed on at least side surfaces of the magnetization-pinned layer 4. Therefore, the spin moment of the magnetization-pinned layer 4 is perpendicularly oriented by exchange coupling between the magnetization-pinned layer 4 and the anti-ferromagnetic film 9 even though the magneto-resistive effect element is miniaturized, and the magnetization of the magnetization-pinned layer 4 does not vary even though switching of the magnetic fields is repeated. Therefore, the magnetization of the magnetization-pinned layer 4 can be kept stable without becoming a plurality of magnetic domains, and the magneto-resistance change ratio can be prevented from being reduced.

When the magneto-resistive effect element according to the third embodiment is used as a memory element of a magnetic memory, the nonmagnetic conductive layer 5 can be used as a bit line.

FOURTH EMBODIMENT

Figure 4:
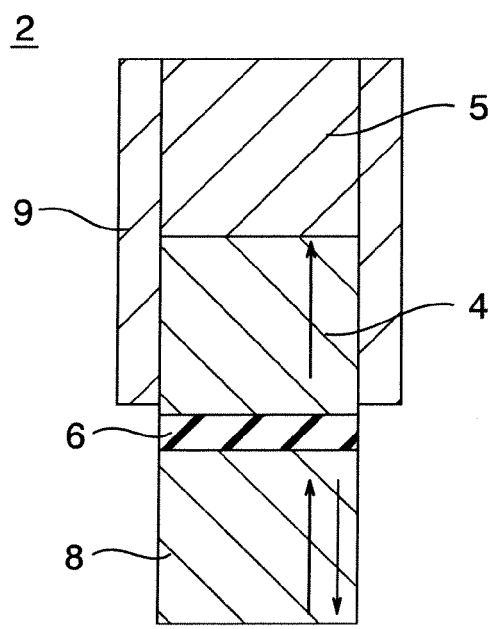
FIG. 4 is a sectional view showing a constitution of a magneto-resistive effect element according to a fourth embodiment of the present invention.

A constitution of a magneto-resistive effect element according to a fourth embodiment of the present invention is shown in FIG. 4. The magneto-resistive effect element 2 according to the embodiment has a constitution obtained by forming a nonmagnetic conductive layer 5 on the upper surface of the magnetization-pinned layer 4 in the magneto-resistive effect element 2 according to the second embodiment shown in FIG. 2.

In the magneto-resistive effect element according to the embodiment, the anti-ferromagnetic film 9 is formed on side surfaces of the magnetization-pinned layer 4. In this manner, the spin moment of the magnetization-pinned layer 4 is perpendicularly oriented by exchange coupling between the magnetization-pinned layer 4 and the anti-ferromagnetic film 9 even though the magneto-resistive effect element is miniaturized, and the magnetization of the magnetization-pinned layer 4 does not vary even though switching of the magnetic fields is repeated. Therefore, the magnetization of the magnetization-pinned layer 4 can be kept stable without becoming a plurality of magnetic domains, and the magneto-resistance change ratio can be prevented from being reduced.

When the magneto-resistive effect element according to the fourth embodiment is used as a memory element of a magnetic memory, the nonmagnetic conductive layer 5 can be used as a bit line.

FIFTH EMBODIMENT

Figure 5:
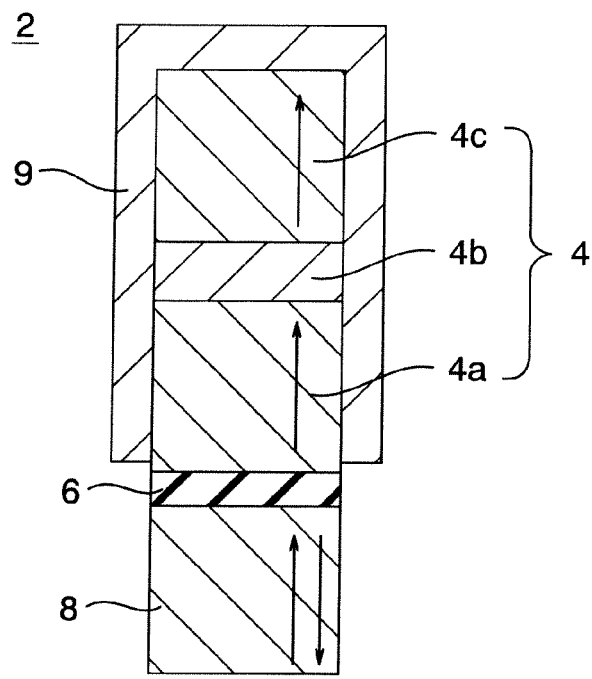
FIG. 5 is a sectional view showing a constitution of a magneto-resistive effect element according to a fifth embodiment of the present invention.

A constitution of a magneto-resistive effect element according to a fifth embodiment of the present invention is shown in FIG. 5. The magneto-resistive effect element 2 according to the embodiment uses a top-pin type tunnel single junction, and has a magnetization-pinned layer 4 having a laminated structure constituted by a perpendicular magnetic layer 4a, a nonmagnetic conductive layer 4b, and a hard bias layer (bias-applied magnetic layer) 4c in the magneto-resistive effect element 2 according to the first embodiment shown in FIG. 1. More specifically, the hard bias layer 4c is formed on the perpendicular magnetic layer 4a through the nonmagnetic conductive layer 4b. As in the embodiment, the bias-applied magnetic layer 4c is formed to make it possible to reduce a demagnetizing field, and more stable characteristics can be obtained. Therefore, a reliable magneto-resistive effect element can be obtained.

In the magneto-resistive effect element according to this embodiment, the anti-ferromagnetic film 9 is also formed on at least side surfaces of the magnetization-pinned layer 4. Therefore, the spin moment of the magnetization-pinned layer 4 is perpendicularly oriented by exchange coupling between the magnetization-pinned layer 4 and the anti-ferromagnetic film 9 even though the magneto-resistive effect element is miniaturized, and the magnetization of the magnetization-pinned layer 4 does not vary even though switching of the magnetic fields is repeated. Therefore, the magnetization of the magnetization-pinned layer 4 can be kept stable without becoming a plurality of magnetic domains, and the magneto-resistance change ratio can be prevented from being reduced.

SIXTH EMBODIMENT

Figure 6:
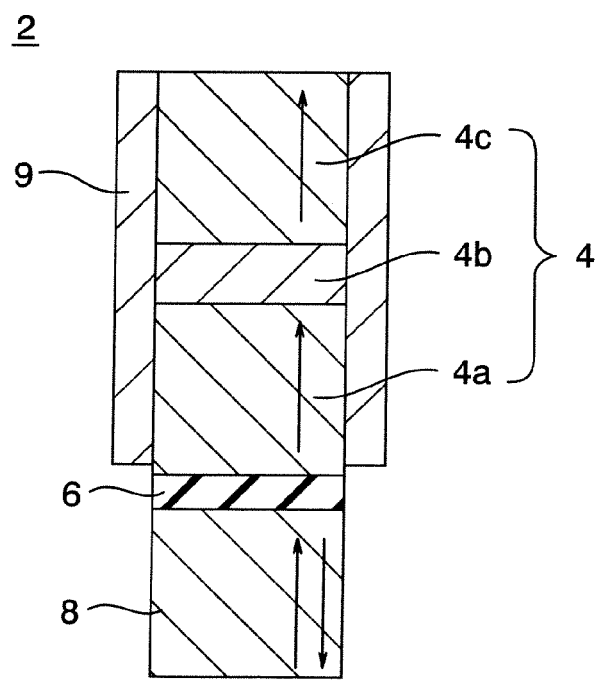
FIG. 6 is a sectional view showing a constitution of a magneto-resistive effect element according to a sixth embodiment of the present invention.

A constitution of a magneto-resistive effect element according to the sixth embodiment of the present invention is shown in FIG. 6. The magneto-resistive effect element 2 according to the embodiment is a top-pin type tunnel single junction, and has a magnetization-pinned layer 4 having a laminated structure constituted by a perpendicular magnetic layer 4a, a nonmagnetic conductive layer 4b, and a hard bias layer (bias-applied magnetic layer) 4c in the magneto-resistive effect element 2 according to the first embodiment shown in FIG. 2. More specifically, the hard bias layer 4c is formed on the perpendicular magnetic layer 4a through the nonmagnetic conductive layer 4b. As in this embodiment, the bias-applied magnetic layer is formed to make it possible to reduce a demagnetizing field, and more stable characteristics can be obtained. Therefore, a reliable magneto-resistive effect element can be obtained.

In the magneto-resistive effect element according to the embodiment, the anti-ferromagnetic film 9 is also formed on at least side surfaces of the magnetization-pinned layer 4. Therefore, the spin moment of the magnetization-pinned layer 4 is perpendicularly oriented by exchange coupling between the magnetization-pinned layer 4 and the anti-ferromagnetic film 9 even though the magneto-resistive effect element is miniaturized, and the magnetization of the magnetization-pinned layer 4 does not vary even though switching of the magnetic fields is repeated. Therefore, the magnetization of the magnetization-pinned layer 4 can be kept stable without becoming a plurality of magnetic domains, and the magneto-resistance change ratio can be prevented from being reduced.

SEVENTH EMBODIMENT

Figure 7:
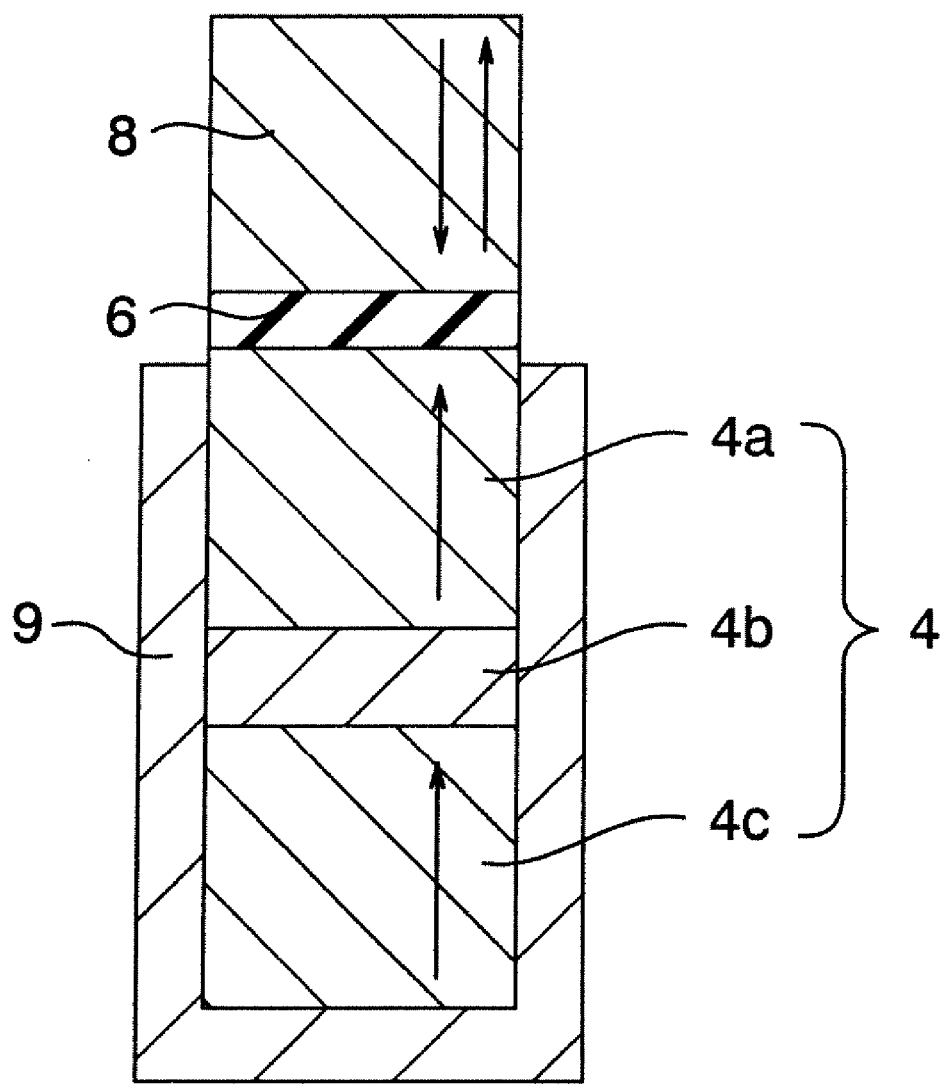
FIG. 7 is a sectional view showing a constitution of a magneto-resistive effect element according to a seventh embodiment of the present invention.

A constitution of a magneto-resistive effect element according to a seventh embodiment of the present invention is shown in FIG. 7. The magneto-resistive effect element 2 according to the embodiment uses a bottom-pin type tunnel single junction, and has a configuration obtained by turning the magneto-resistive effect element 2 according to the fifth embodiment shown in FIG. 5 upside down. More specifically, the magnetization-pinned layer 4 has a laminated structure constituted by a hard bias layer (bias-applied magnetic layer) 4c, a nonmagnetic conductive layer 4b, and a perpendicular magnetic layer 4a. In the configuration, a tunnel barrier layer 6 is formed on the perpendicular magnetic layer 4a, a magnetization free layer 8 is formed on the tunnel barrier layer 6, and a anti-ferromagnetic film 9 is formed on side surfaces of the magnetization-pinned layer 4 and the bottom surface (the bottom surface of the hard bias layer 4c) of the magnetization-pinned layer 4.

As in this embodiment, the bias-applied magnetic layer is formed to make it possible to reduce a demagnetizing field, and more stable characteristics can be obtained. Therefore, a reliable magneto-resistive effect element can be obtained.

In the magneto-resistive effect element according to the embodiment, the anti-ferromagnetic film 9 is also formed on at least side surfaces of the magnetization-pinned layer 4. Therefore, the spin moment of the magnetization-pinned layer 4 is perpendicularly oriented by exchange coupling between the magnetization-pinned layer 4 and the anti-ferromagnetic film 9 even though the magneto-resistive effect element is miniaturized, and the magnetization of the magnetization-pinned layer 4 does not vary even though switching of the magnetic fields is repeated. Therefore, the magnetization of the magnetization-pinned layer 4 can be kept stable without becoming a plurality of magnetic domains, and the magneto-resistance change rate can be prevented from being reduced.

The magneto-resistive effect elements according to the first to sixth embodiments use top-pin type tunnel single junctions. However, as in the seventh embodiment, the magneto-resistive effect element may use the bottom-pin type single junction.

EIGHTH EMBODIMENT

Figure 8:
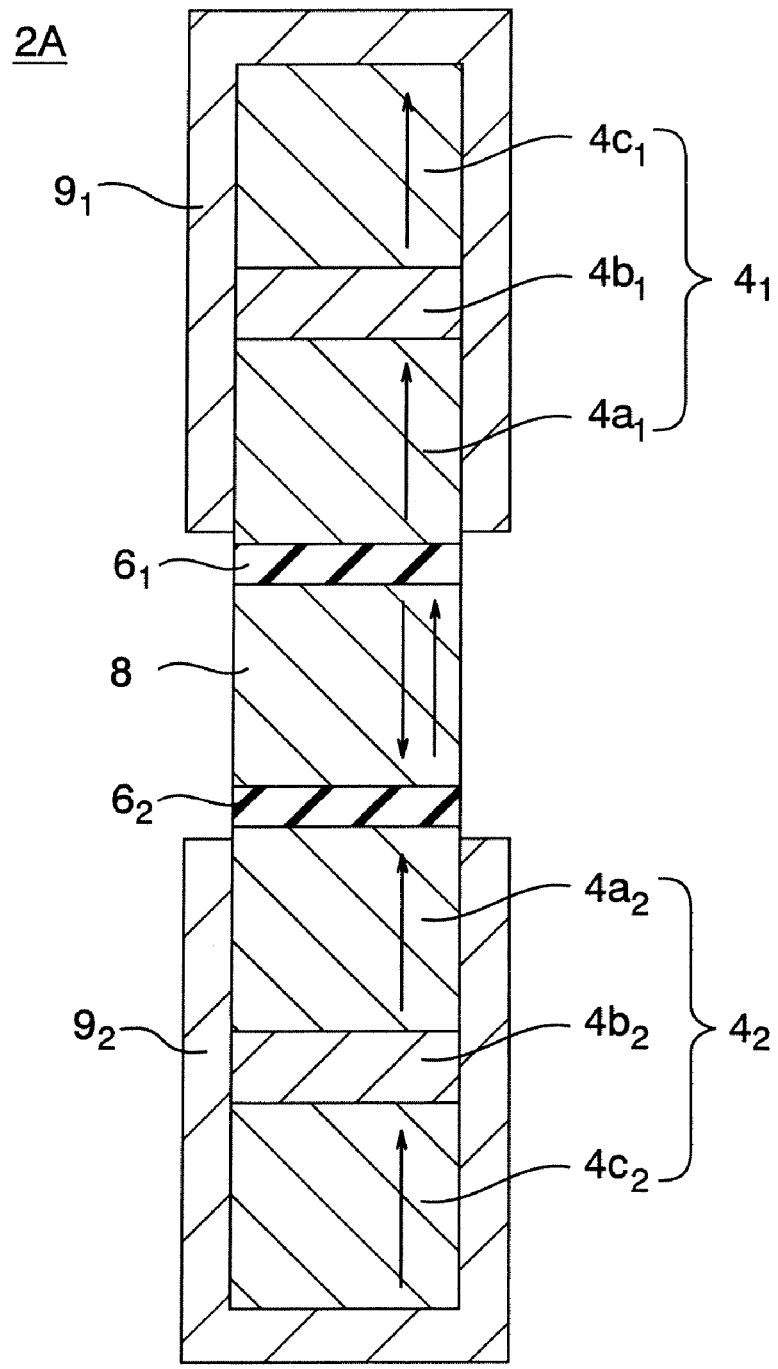
FIG. 8 is a sectional view showing a constitution of a magneto-resistive effect element according to a eighth embodiment of the present invention.

A configuration of a magneto-resistive effect element according to the eighth embodiment of the present invention is shown in FIG. 8. A magneto-resistive effect element 2A uses dual tunnel junctions, and has a configuration in which the magnetization free layer 8 of the magneto-resistive effect element according to the fifth embodiment shown in FIG. 5 and the magnetization free layer 8 of the magneto-resistive effect element according to the seventh embodiment shown in FIG. 7 are shared. More specifically, a magnetization-pinned layer $4_2$ has a laminated structure constituted by a hard bias layer (bias-applied magnetic layer) $4c_2$, a nonmagnetic conductive layer $4b_2$, and a perpendicular magnetic layer $4a_2$. A tunnel barrier layer $6_2$ is formed on the perpendicular magnetic layer $4a_2$, a magnetization free layer 8 is formed on the tunnel barrier layer $6_2$, and a tunnel barrier layer $6_1$ is formed on the magnetization free layer 8. A magnetization-pinned layer $4_1$ having a laminated structure constituted by a perpendicular magnetic layer $4a_1$, a nonmagnetic conductive layer $4b_1$, and a hard bias layer $4c_1$ is formed on the tunnel barrier layer $6_1$. The side surfaces and the upper surface of the magnetization-pinned layer $4_1$ are covered with an anti-ferromagnetic film $9_1$, and the side surfaces and the bottom surface of the magnetization-pinned layer $4_2$ are covered with a anti-ferromagnetic film $9_2$.

Even in this embodiment, at least the side surfaces of the magnetization-pinned layer $4_1$ is covered with the anti-ferromagnetic film $9_1$, and at least the side surfaces of the magnetization-pinned layer $4_2$ is covered with the anti-ferromagnetic film $9_2$. In this manner, the spin moments of the magnetization-pinned layers $4_1$ and $4_2$ are perpendicularly oriented by exchange coupling between the magnetization-pinned layers $4_1$, $4_2$ and the anti-ferromagnetic films $9_1$, $9_2$ even though the magneto-resistive effect element is miniaturized, and the magnetizations of the magnetization-pinned layers $4_1$ and $4_2$ do not vary even though switching of the magnetic fields is repeated. Therefore, each of the magnetizations of the magnetization-pinned layer $4_1$ and $4_2$ can be kept stable without becoming a plurality of magnetic domains, and the magneto-resistance change ratio can be prevented from being reduced.

In this embodiment, the dual tunnel junctions obtained such that the magnetization free layers of the magneto-resistive effect element using the top-pin type tunnel single junction according to the fifth embodiment and the magneto-resistive effect element using the bottom-pin type tunnel single junction according to the seventh embodiment are connected to each other to share the magnetization free layers is used. However, the following configuration may be used. That is, any one of the top-pin type tunnel single junction magneto-resistive effect elements according to the first to fifth embodiments and a bottom-pin type magneto-resistive effect element formed on the basis of one of the magneto-resistive effect elements according to the first to fifth embodiments are connected such that the magnetization free layers are shared, thereby forming a dual tunnel junctions magneto-resistive effect element.

In the magneto-resistive effect elements according to the first to eighth embodiments, even though a planar aspect ratio, i.e., a ratio of the minor axis to the major axis is 1.5 or less, a spin moment is stably present, thereby it is possible to reduce an area per bit. Therefore, the magneto-resistive effect elements according to the first to eighth embodiments are suitably used as memory elements of large-capacity nonvolatile memories, and have excellent heat stability. The magneto-resistive effect element is formed on the basis of a design rule of 0.1 μm or less, a spin magnetic moment is stably kept, and an MRAM having a capacity larger than 1 Gbit can be practically applied.

In the magneto-resistive effect elements according to the above-mentioned embodiments, a ferromagnetic material which can be used as a magnetization-pinned layer or a magnetic recording layer will be described below.

As a magnetic material of a magnetization-pinned layer, Co, Fe, Ni, an alloy thereof (Co—Fe alloy, Co—Ni alloy, Ni—Fe alloy, or a Co—Ni—Fe alloy), Co—Cr—Pt—Ta, Co—Cr—Nb—Pt, Co—Cr—Pt, Co—Cr—Pt/Ti, Co—Pt—Cr—O, Co—Cr—Pt—SiO$_2$, Co—Cr—Pt—B, Fe—Pt, Tb—Fe—Co, Pr—Tb—Co, or the like can be used. And as a magnetization-pinned layer, a multi-layered film consisting of Co—Cr—Ta/Co—Zr—Nb/Co—Sm, a multi-layered film obtained by laminating layers consisting of Co—Cr—Ta and Pt, a multi-layered film obtained by laminating layers consisting of Co and Pd, a multi-layered film obtained by laminating layers consisting of Co—B and Pd, or the like can be used. Symbols "X-Y" denote contained components X and Y, and a symbol "/" denotes a laminated structure.

As a magnetic material of a magnetization free layer serving as a magnetic recording layer, Co—Cr—Pt—Ta, Co—Cr—Nb—Pt, Co—Cr—Pt, Co—Pt—Cr—O, Co—Cr—Pt—SiO$_2$, Co—Cr—Pt—B, Fe—Pt, Tb—Fe—Co, Pr—Tb—Co, or the like can be used. And as a magnetization free layer serving as a magnetic recording layer, a multi-layered film consisting of Co—Cr—Pt/Ti, or Co—Cr—Ta/Co—Zr—Nb/Co—Sm, a multi-layered film obtained by laminating layers consisting of Co—Cr—Ta and Pt, a multi-layered film obtained by laminating layers consisting of Co and Pd, a multi-layered film obtained by laminating layers consisting of Co—B and Pd, or the like can be used.

The magnetization-pinned layer consisting of one of these materials has a unidirectional magnetic anisotropy by exchange coupling between the magnetization-pinned layer and the anti-ferromagnetic layer on the side surfaces. The magnetic recording layer (magnetization free layer) desirably has a uni-axial magnetic anisotropy in a direction perpendicular to the film surface. The thickness of the magnetic recording layer is not limited to a specific thickness. However, the thickness preferably falls within 1 nm to 100 nm. In addition, since the film thicknesses of the ferromagnetic layers constituting the magnetization-pinned layer and the magnetization free layer have magnetic anisotropy in the perpendicular direction, the film thicknesses can be increased. A magneto-resistive effect element having a tolerance to thermal fluctuation can be obtained even though the magneto-resistive effect element is miniaturized.

Further, it is preferable that magnetization of a ferromagnetic layer used as the magnetization-pinned layer is fixed by providing an anti-ferromagnetic film to the magnetization-pinned layer. Such an anti-ferromagnetic film can comprise Fe (iron)-Mn (manganese), Pt (platinum-Mn (manganese), Pt (platinum)-Cr (chromium)-Mn (manganese), Ni (nickel)-Mn (manganese), Ir (iridium)-Mn (manganese), NiO (nickel oxide), $Fe_2O_3$ (iron oxide) or the like.

Furthermore, the magnetic characteristic of magnetic material used may be adjusted by adding thereto nonmagnetic element such as Ag (silver), Cu (copper), Au (gold), Al (aluminum), Mg (magnesium), Si (silicone), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium) or the like. Besides, various physical properties such as crystallization, mechanical properties, chemical properties or the like can be adjusted. Furthermore, some Fe (iron) may be added to a Co-based alloy used in the magnetic recording layer.

On the other hand, a stacked layer film comprising a ferromagnetic layer and a nonmagnetic layer may be used as the magnetization-pinned layer or the magnetic recording layer. For example, a film having a three-layered structure including a ferromagnetic layer/a nonmagnetic layer/a ferromagnetic layer or a multi-layered film with three or more layers may be used. In this case, it is preferable that an anti-ferromagnetic interaction acts to the ferromagnetic layers sandwiching the nonmagnetic layer.

The nonmagnetic material is not limited to a specific nonmagnetic material. However, as nonmagnetic material, for example, Ru (ruthenium), Ir (iridium), Os (osmium), Re (Rhenium), Cu (copper), Ag (silver), Au (gold), Ta (tantalum), W (tungsten), Si (silicon), Bi (bismuth), B (boron), C (carbon), Pd (palladium), Pt (platinum), Zr (zirconium), Nb (niobium), V (vanadium), Mo (molybdenum), an alloy thereof, or the like can be used. When this structure is used, a demagnetizing field can be reduced by a biased magnetic field, and the magnetization of the magnetization-pinned layer is easily affected by the influence of a magnetic field induced by flowing a current to a bit line or a word line, thereby the magnetization can be firmly pinned. The film thickness of the nonmagnetic layer must be set to prevent super paramagnetism from being generated, and more desirably set at 0.4 nm or more and 10 nm or less.

Even in the magnetic recording layer, a nonmagnetic element such as Ag (silver), Cu (copper), Au (gold), Al (aluminum), Ru (ruthenium), Os (osmium), Re (rhenium), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium), or the like is added to the magnetic material to make it possible to control magnetic characteristics. In addition, various physicalities such as crystallinity, mechanical characteristics, chemical characteristics can be controlled.

On the other hand, when a TMR element is used as a magneto-resistive effect element, as an insulating layer (or a dielectric layer) formed between a magnetization-pinned layer and a magnetic recording layer, $Al_2O_3$ (aluminum oxide), $SiO_2$ (silicon oxide), MgO (magnesium oxide), AlN (aluminum nitride), $Bi_2O_3$ (bismuth oxide), $MgF_2$ (magnesium fluoride), $CaF_2$ (calcium fluoride), $SrTiO_2$ (strontium titanium dioxide), $AlLaO_3$ (aluminum lanthanum trioxide), Al—N—O (aluminum oxynitride), or the like can be used.

These compounds need not have a perfectly precise stoichiometric composition. Oxygen, nitrogen, fluorine, or the like may be lacked, or may be over or short. In addition, it is desired that the thickness of the insulating layer (dielectric layer) is so small that a tunnel current flows in the insulating layer. Actually, the thickness is desirably 10 nm or less.

The magneto-resistive effect element can be formed on a predetermined substrate by using a conventional thin-film forming means such as various sputtering methods, a deposition method, or molecular beam epitaxy. As a substrate used in this case, for example, various substrates such as Si (silicon), $SiO_2$ (silicon oxide), $Al_2O_3$ (aluminum oxide), spinel, and AlN (aluminum nitride) can be used.

On the substrate, as an underlying layer, a protective layer, or a hard mask, a specific layer is not formed. However, a layer consisting of Ta (tantalum) Ti (titanium), Pt (platinum), Pd (palladium), Au (gold), Ti (titanium)/Pt (platinum), Ta (tantalum)/Pt (platinum), Ti (titanium)/Pd (palladium), Ta (tantalum)/Pd (palladium), Cu (copper), Al (aluminum)-Cu (copper), Ru (ruthenium), Ir (iridium), Os (osmium), or the like may be formed.

NINTH EMBODIMENT

Before the explanation of a magnetic memory according to a ninth embodiment of the present invention, a memory cell structure used in the magnetic memory according to the present invention will be described below.

FIRST CONCRETE EXAMPLE

Figure 9:
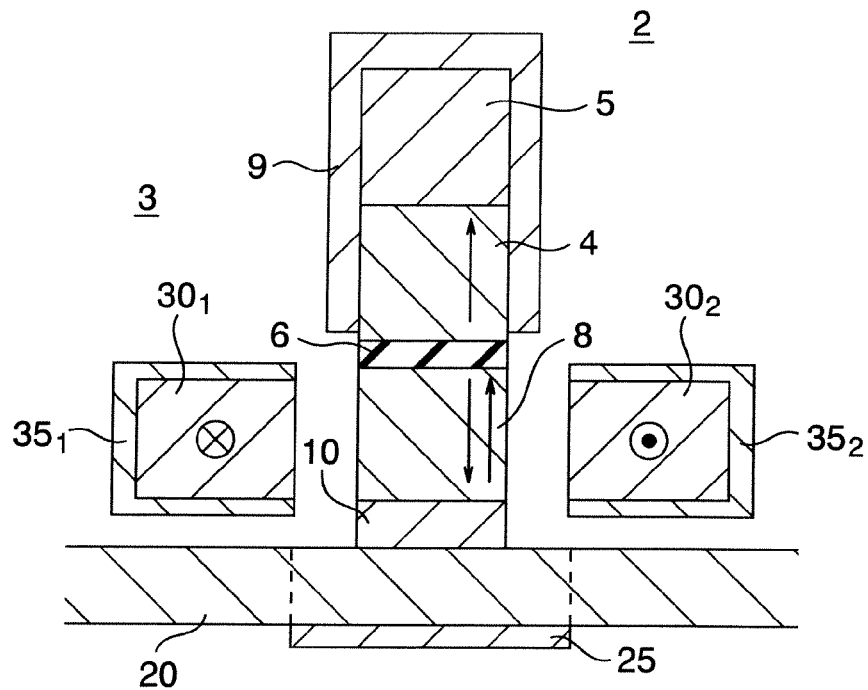
FIG. 9 is a sectional view showing a constitution of a first concrete example of a memory structure used in a magnetic memory according to the present invention.

The first concrete example of a memory cell 3 having a simple matrix architecture structure which uses a MOS transistor on only the peripheral portion of a memory array and which does not use selective transistors bit by bit is shown in FIG. 9. The memory cell 3 according to the concrete example comprises a magneto-resistive effect element 2 according to the third embodiment, an underlying layer 10 formed on the lower surface of a magnetization free layer 8 of the magneto-resistive effect element 2, a bit line 20 electrically connected to the underlying layer 10, a pair of word lines $30_1$ and $30_2$ formed on the side of the magnetization free layer through an insulating film, and a conductive layer 5 formed on the magnetization-pinned layer 4 of the magneto-resistive effect element 2 also serves as a bit line. A magnetic covering film 25 is formed on the bit line 20, and magnetic covering films $35_1$ and $35_2$ are formed on the word lines $30_1$ and $30_2$, respectively.

In the first concrete example, data is read by turning on a MOS transistor connected to the bit lines 20 and 5 to flow a sense current in the magneto-resistive effect element 2. Data is written by using orthogonal bit lines 20 and the pair of word lines $30_1$ and $30_2$. Opposite current pulses are applied to the two word lines $30_1$ and $30_2$, respectively. At this time, the end portions of the two word lines $30_1$ and $30_2$ are electrically connected to the end portion of the memory array block to make it possible that the current pulses are applied to the word lines $30_1$ and $30_2$ by one driver and one sinker, so that memory array efficiency can be improved. The magnetic covering films 25, $35_1$, and $35_2$ are applied to the bit line 20 and the word lines $30_1$ and $30_2$ which are used to write data. When the magnetic covering film structure is used, a current required to write data can be reduced, and data can be written with a low power consumption and a small current.

The memory cell according to the first concrete example has an advantage over a memory cell according to the second concrete example with respect to the number of steps of etching, the number of masks, and manufacturing cost.

SECOND EMBODIMENT

Figure 10:
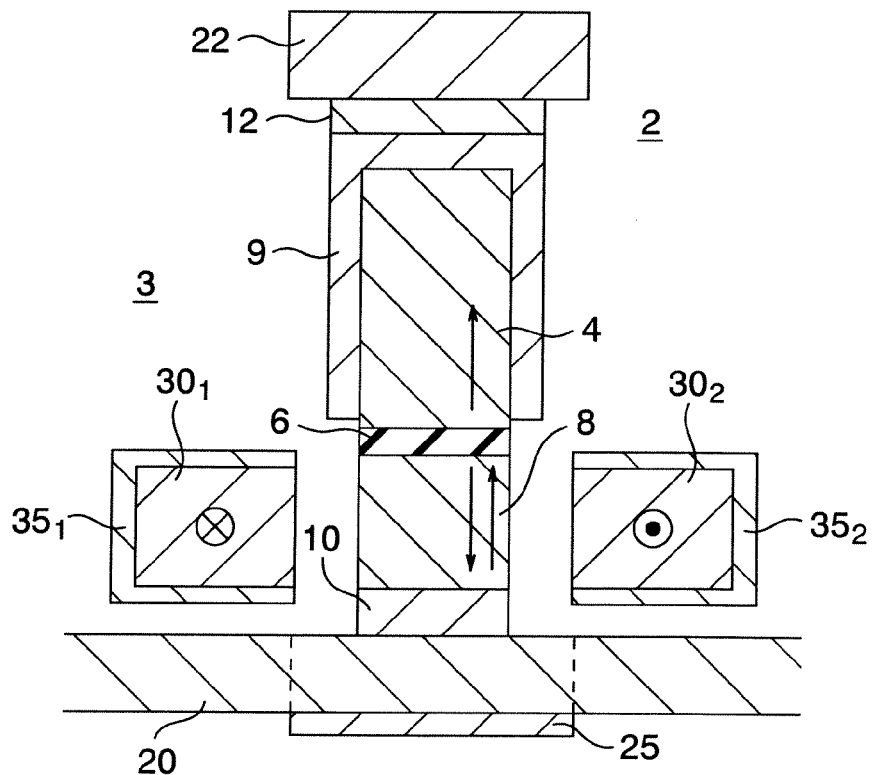
FIG. 10 is a sectional view showing a constitution of a second concrete example of the memory structure used in the magnetic memory according to the present invention.

A constitution of a second concrete example of a memory cell used in a magnetic memory according to the present invention is shown in FIG. 10. The memory cell 3 according to the concrete example has a simple matrix architecture structure which uses a MOS transistor on only the peripheral portion of a memory array and which does not use selective transistors bit by bit. The memory cell 3 comprises a magneto-resistive effect element 2 according to the first embodiment, an underlying layer 10 formed on the lower surface of a magnetization free layer 8 of the magneto-resistive effect element 2, a bit line 20 electrically connected to the underlying layer 10, a pair of word lines $30_1$ and $30_2$ formed on the side of the magnetization free layer through an insulating film, a conductive layer 12 connected to the upper surface of the magneto-resistive effect element 2, and a bit line 22 electrically connected to the conductive layer 12. A magnetic covering film 25 is formed on the bit line 20, and magnetic covering films $35_1$ and $35_2$ are formed on the word lines $30_1$ and $30_2$, respectively.

In the second concrete example, data is read by turning on a MOS transistor connected to the bit line 20 and the bit line 22 to flow a sense current in the magneto-resistive effect element 2. Data is written by using orthogonal bit lines 20 and the pair of word lines $30_1$ and $30_2$. Opposite current pulses are applied to the two word lines $30_1$ and $30_2$, respectively. At this time, the end portions of the two word lines $30_1$ and $30_2$ are electrically connected to the end portion of the memory array block to make it possible that the current pulses are applied to the word lines $30_1$ and $30_2$ by one driver and one sinker, so that memory array efficiency can be improved. The magnetic covering films 25, $35_1$, and $35_2$ are applied to the bit line 20 and the word lines $30_1$ and $30_2$ which are used to write data. When the magnetic covering film structure is used, a current required to write data can be reduced, and data can be written with a low power consumption and a small current.

THIRD CONCRETE EXAMPLE

Figure 11:
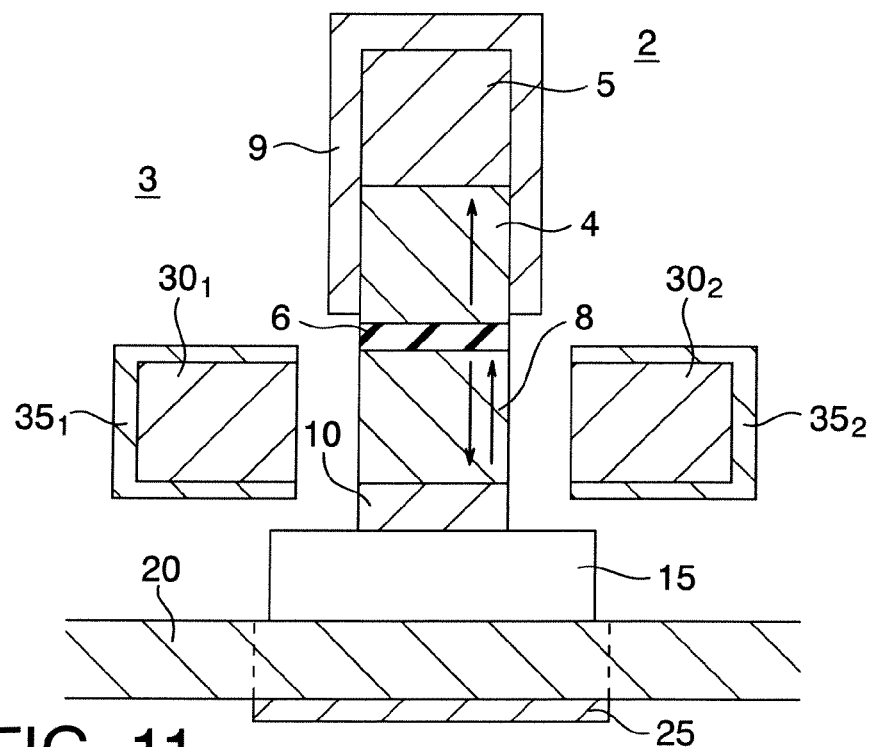
FIG. 11 is a sectional view showing a constitution of a third concrete example of the memory structure used in the magnetic memory according to the present invention.

A constitution of a third concrete example of a memory cell used in a magnetic memory according to the present invention is shown in FIG. 11. The memory cell 3 according to the concrete example has a simple matrix architecture structure which uses a MOS transistor on only the peripheral portion of a memory array and which does not use selective transistors bit by bit. The memory cell 3 comprises a magneto-resistive effect element 2 according to the third embodiment, an underlying layer 10 formed on the lower surface of a magnetization free layer 8 of the magneto-resistive effect element 2, a diode 15, a bit line 20 electrically connected to the underlying layer 10 through the diode 15, and a pair of word lines $30_1$ and $30_2$ formed on the side of the magnetization free layer through an insulating film. A conductive layer 5 formed on a magnetization-pinned layer 4 of the magneto-resistive effect element 2 also serves as a bit line. A magnetic covering film 25 is formed on the bit line 20, and magnetic covering films $35_1$ and $35_2$ are formed on the word lines $30_1$ and $30_2$, respectively.

In the third concrete example, data is read by turning on a MOS transistor connected to the bit line 20 and the bit line 5 to flow a sense current in the magneto-resistive effect element 2. In a memory cell of a type which does not use a diode as in the first or second concrete example, in a read operation, a transistor connected to another bit line is opened, or the voltages of the bit line 20 and the bit line 5 are made constant to reduce a current flowing around a non-selected magneto-resistive effect element as much as possible. However, disadvantageously, the current cannot be exactly zero. However, as in the concrete example, the diode 15 is interposed between the underlying layer 10 and the bit line 20, so that the problem can be solved. As in the second concrete example, data is written by using orthogonal bit lines 20 and the pair of word lines $30_1$ and $30_2$. Opposite current pulses are applied to the two word lines $30_1$ and $30_2$, respectively. At this time, the end portions of the two word lines $30_1$ and $30_2$ are electrically connected to the end portion of the memory array block to make it possible that the current pulses are applied to the word lines $30_1$ and $30_2$ by one driver and one sinker, so that memory array efficiency can be improved. The magnetic covering films 25, $35_1$, and $35_2$ are applied to the bit line 20 and the word lines $30_1$ and $30_2$ which are used to write data as described above. When the magnetic covering film structure is used, a current required to write data can be reduced, and data can be written with a low power consumption and a small current.

The structure of the concrete example has an advantage over a structure according to a fourth concrete example (will be described later) with respect to the number of steps of etching, the number of masks, and manufacturing cost.

FOURTH CONCRETE EXAMPLE

Figure 12:
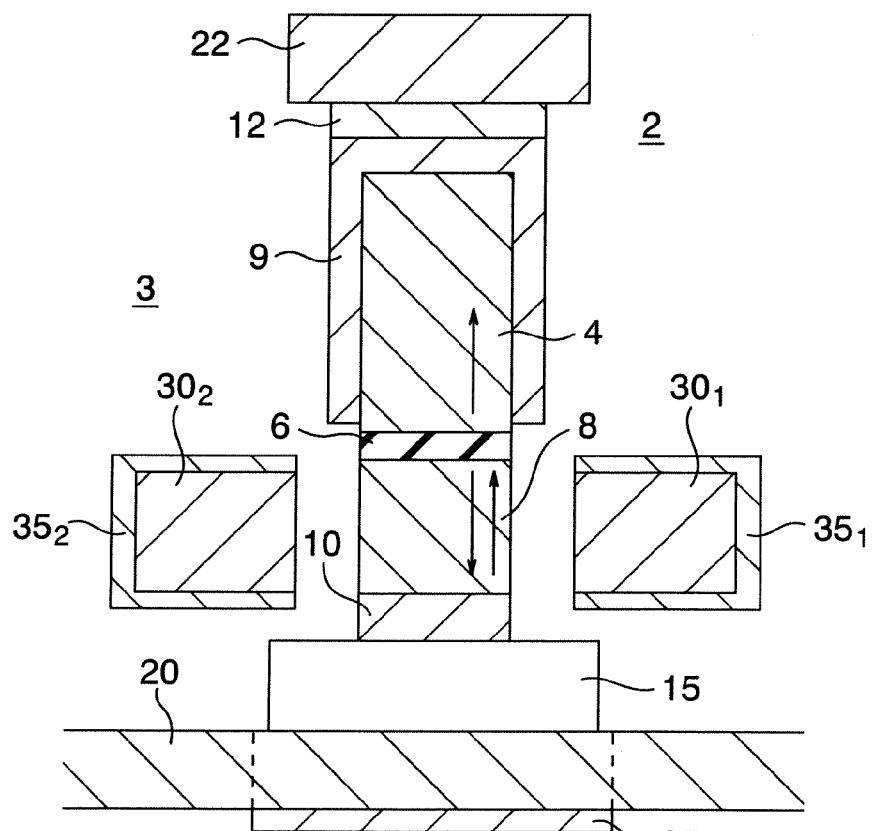
FIG. 12 is a sectional view showing a constitution of a fourth concrete example of the memory structure used in the magnetic memory according to the present invention.

A constitution of a fourth concrete example of a memory cell used in a magnetic memory according to the present invention is shown in FIG. 12. The memory cell 3 according to the concrete example has a simple matrix architecture structure which uses a MOS transistor on only the peripheral portion of a memory array and which does not use selective transistors bit by bit. The memory cell 3 comprises a magneto-resistive effect element 2 according to the first embodiment, an underlying layer 10 formed on the lower surface of a magnetization free layer 8 of the magneto-resistive effect element 2, a diode 15, a bit line 20 electrically connected to the underlying layer 10 through the diode 15, a pair of word lines $30_1$ and $30_2$ formed on the side of the magnetization free layer through an insulating film, a conductive layer 12 connected to the upper surface of the magneto-resistive effect element 2, and a bit line 22. A magnetic covering film 25 is formed on the bit line 20, and magnetic covering films $35_1$ and $35_2$ are formed on the word lines $30_1$ and $30_2$, respectively.

In the fourth concrete example, data is read by turning on a MOS transistor connected to the bit line 20 and the bit line 5 to flow a sense current in the magneto-resistive effect element 2. In a memory cell of a type which does not use a diode as in the first or second concrete example, in a read operation, a transistor connected to another bit line is opened, or the voltages of the bit line 20 and the bit line 5 are made constant to reduce a current flowing around a non-selected magneto-resistive effect element as much as possible. However, disadvantageously, the current cannot be exactly zero. However, as in the concrete example, the diode 15 is interposed between the underlying layer 10 and the bit line 20, so that the problem can be solved. As in the first and second concrete examples, data is written by using orthogonal bit lines 20 and the pair of word lines $30_1$ and $30_2$. Opposite current pulses are applied to the two word lines $30_1$ and $30_2$, respectively. At this time, the end portions of the two word lines $30_1$ and $30_2$ are electrically connected to the end portion of the memory array block to make it possible that the current pulses are applied to the word lines $30_1$ and $30_2$ by one driver and one sinker, so that memory array efficiency can be improved. The magnetic covering films 25, $35_1$, and $35_2$ are applied to the bit line 20 and the word lines $30_1$ and $30_2$ which are used to write data as described above. When the magnetic covering film structure is used, a current required to write data can be reduced, and data can be written with a low power consumption and a small current.

Figure 13:
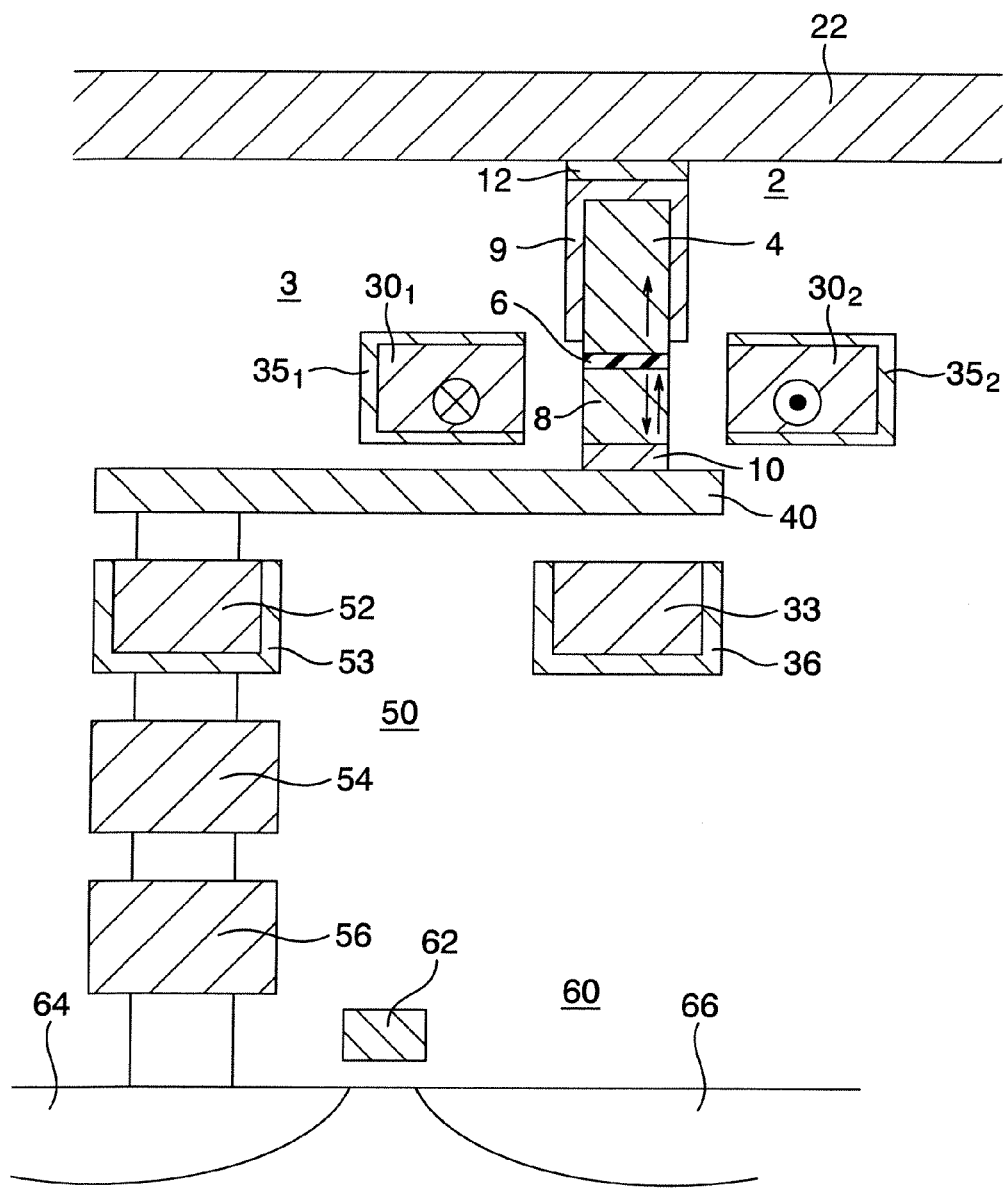
FIG. 13 is a sectional view showing a constitution of a magnetic memory according to a ninth embodiment of the present invention.

A constitution of the magnetic memory according to the ninth embodiment is shown in FIG. 13. The magnetic memory according to the embodiment comprises a plurality of memory cells 3 arranged in the form of an array. Each memory cell 3 has a configuration obtained by replacing the bit line 20 with an underlying electrode 40 and arranging a word line 33, a connection section 50, and a selective transistor 60.

A magnetic covering film 36 is formed on the word line 33. The connection section 50 has connection plugs 52, 54, and 56. Since the connection plug 52 is formed as the same layer as that of the word line 33, a magnetic covering film 53 is formed on the connection plug 52 like the word line 33. The underlying electrode 40 is only used to read data as will be described later, and is not used to write data. For this reason, a magnetic covering film is not formed on the underlying electrode 40. The selective transistor 60 has a gate 62, a drain 64, and a source 66. One end of the connection section 50 connected to the underlying electrode 40, and the other end is connected to the drain 64 of the selective transistor 60.

In the magnetic memory according to this embodiment, data is read by turning on the selective transistor 60 to flow a sense current in the word line 22 through the magneto-resistive effect element 2. Data is written by using the word lines $30_1$ and $30_2$ and the word line 33 parallel to the word lines $30_1$ and $30_2$. A magnetic covering film is applied to the word lines $30_1$ and $30_2$ and the word line 33, as described above. When the magnetic covering film structure is used, a current required to write data can be reduced, and data can be written with a low power consumption and a small current.

Figure 14:
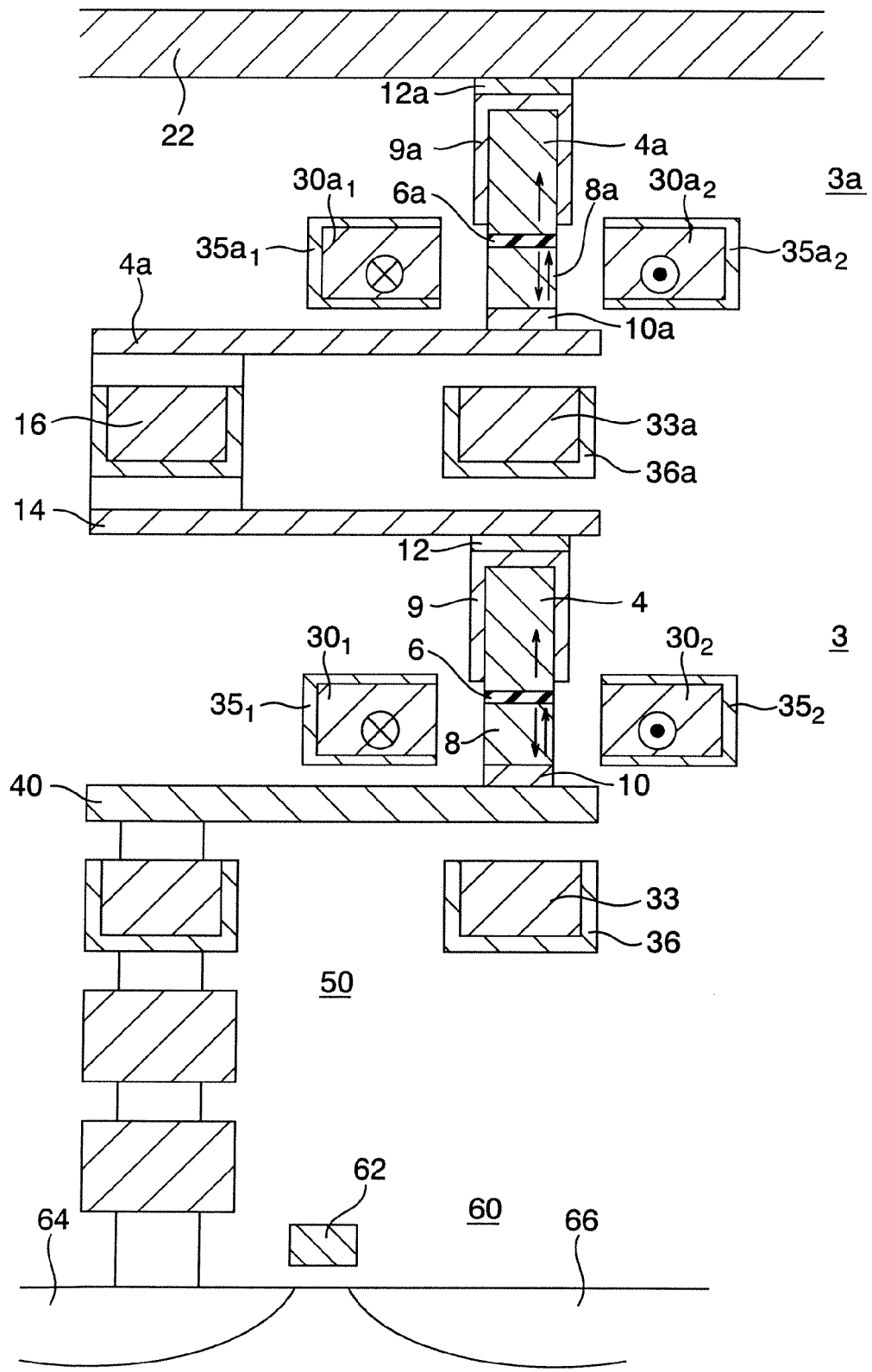
FIG. 14 is a sectional view showing a constitution of a magnetic memory according to a modification of the ninth embodiment of the present invention.
Figure 15:
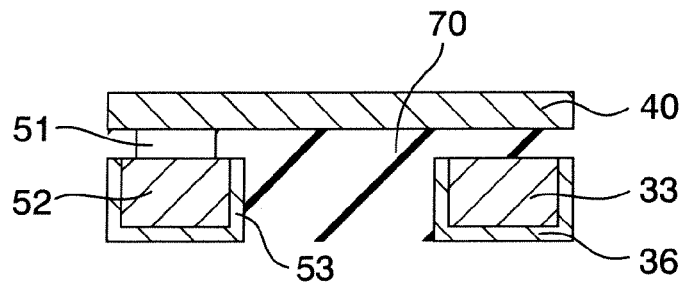
FIG. 15 is a sectional view showing a manufacturing step of a method of manufacturing a magnetic memory according to a tenth embodiment of the present invention.

In order to realize a further very-large capacity memory, a multi-layered structure is desirably obtained by using an architecture in which memory arrays can be laminated. For example, as shown in FIG. 14, a multi-layered structure can be formed by forming a drawing electrode 14, a connection section 16, and a memory cell 3a between the conductive layer 12 and the word line 22 of the memory cell 3 according to this embodiment. The memory cell 3a has the same constitution as that of the memory cell 3. The memory cell 3a comprises an underlying electrode 40a connected to the connection section 16, an underlying layer 10a formed on the underlying electrode 40a, a magnetization free layer 8a formed on the underlying layer 10a, a tunnel barrier layer 6a formed on the magnetization free layer 8a, a magnetization-pinned layer 4a formed on the tunnel barrier layer 6a, an anti-ferromagnetic layer 9a formed to cover the side surface and the upper surface of the magnetization-pinned layer 4a, a conductive layer 12a formed on the anti-ferromagnetic layer 9a, and a pair of word lines $30a_1$ and $30a_2$. In this manner, only the periphery of the magneto-resistive effect element is laminated to make it possible to achieve a large-capacity memory cell.

The memory cells shown in FIGS. 9 to 12 can be easily laminated by repeating the structures of the memory cells as shown in FIG. 14.

TENTH EMBODIMENT

A method of manufacturing a magnetic memory according to the tenth embodiment of the present invention will be described below with reference to FIGS. 15 to 27. This embodiment is a method of manufacturing a magnetic memory having a memory cell structure having one transistor and one magneto-resistive effect element shown in FIG. 13.

It is assumed that a selective transistor 60, a connection section 50, and a word line 33 shown in FIG. 13 are formed on a substrate. On an insulating film 70 in which a tungsten via 51 connected to a connection plug 52 of the connection section 50 is formed, an underlying electrode layer 40 consisting of Ta (see FIG. 15). Subsequently, a layer consisting of a metal (using Pt in this embodiment) which is not easily etched by RIE (Reactive Ion Etching) is formed on the underlying electrode layer 40. Thereafter, a layer consisting of Pt is patterned to form a Pt layer 10a on the word line 33 (see FIG. 16). The underlying electrode layer 40 consisting of Ta is patterned to form an underlying electrode 40 (see FIG. 16).

Figure 16:
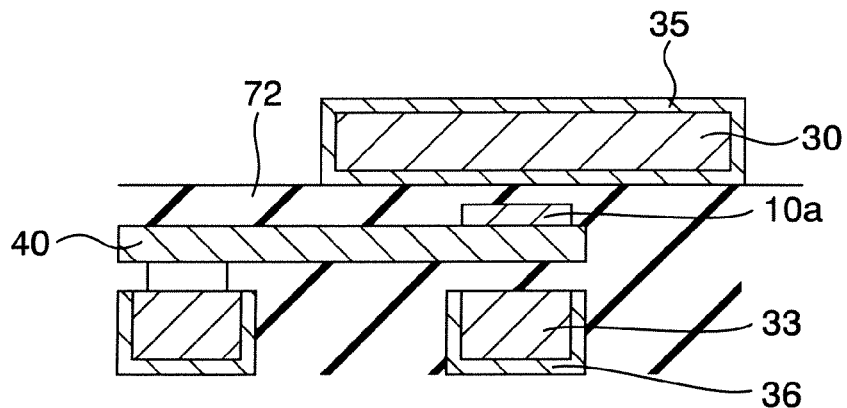
FIG. 16 is a sectional view showing a manufacturing step of the method of manufacturing the magnetic memory according to the tenth embodiment of the present invention.

As shown in FIG. 16, an SiOx film 72 is formed and flattened by CMP (Chemical Mechanical Polishing), and a laminated film consisting of NiFe/Ta/AlCu/Ta/NiFe is formed. A resist pattern (not shown) is formed. The laminated film consisting of NiFe/Ta/AlCu/Ta/NiFe is patterned by using the resist pattern as a mask to form a word line forming film. Subsequently, the resultant structure is sputtered to form an NiFe film on the side surface of a word line forming film 30, and the resist pattern is peeled to form the word line forming film 30 and a magnetic covering film 35 covering the word line forming film 30 (see FIG. 16). More specifically, the word line forming film 30 consists of Ta/AlCu/Ta, and the magnetic covering film 35 consists of NiFe.

Figure 17:
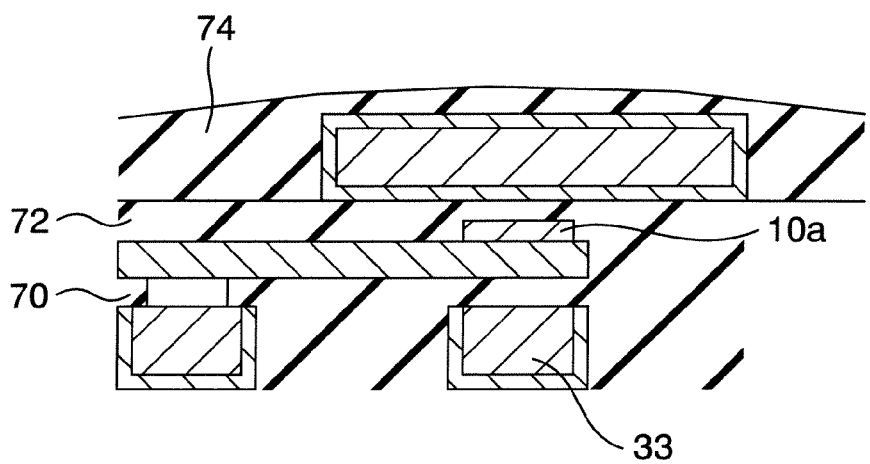
FIG. 17 is a sectional view showing a manufacturing step of the method of manufacturing the magnetic memory according to the tenth embodiment of the present invention.
Figure 18:
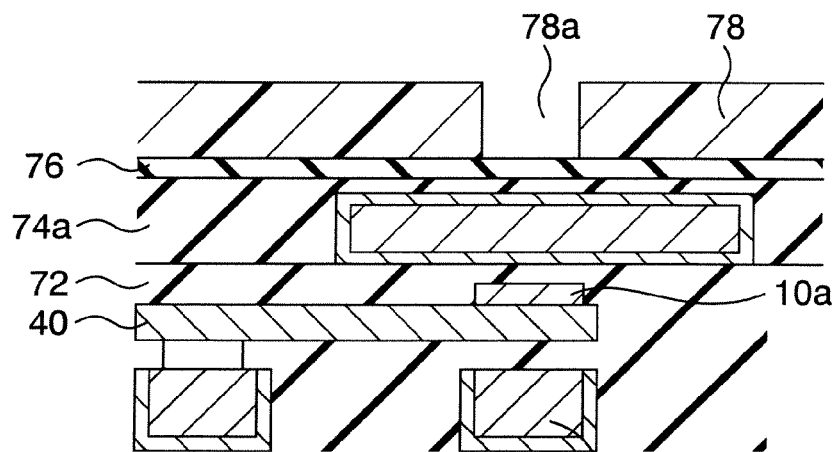
FIG. 18 is a sectional view showing a manufacturing step of the method of manufacturing the magnetic memory according to the tenth embodiment of the present invention.

An SiOx film 74 is formed on the entire surface of the substrate (see FIG. 17). Thereafter, the SiOx film 74 is flattened by using CMP (Chemical Mechanical Polishing) to form a flattened SiOx film 74a (see FIG. 18). Subsequently, an SiNx film 76 is formed on the SiOx film 74a to coat and develop the resist, thereby a resist pattern 78 having an opening 78a on the word line 33, i.e., at the almost center of the word line forming film 30 (see FIG. 18).

Figure 19:
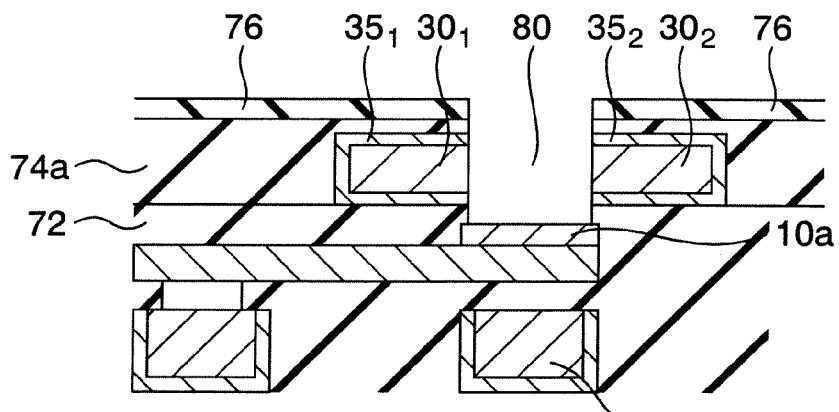
FIG. 19 is a sectional view showing a manufacturing step of the method of manufacturing the magnetic memory according to the tenth embodiment of the present invention.

The SiNx film 76 is patterned by using an RIE method by using the resist pattern 78 as a mask, and the resist pattern 78 is removed. By using the patterned SiNx film 76 as a mask, the SiOx film 74a, the word line forming films 30 and 35, and the SiOx film 72 are etched by using the RIE method to form an opening 80 (see FIG. 19) on the Pt layer 10a. This etching, as shown in FIG. 19, is stopped to the Pt layer 10a. The opening 80 is formed to divide the word line forming film 30 into a pair of word lines $30_1$ and $30_2$. The opening 80 has an inverted-taper section which is widened toward the bottom surface. However, the section is not shown in FIG. 19.

Figure 20:
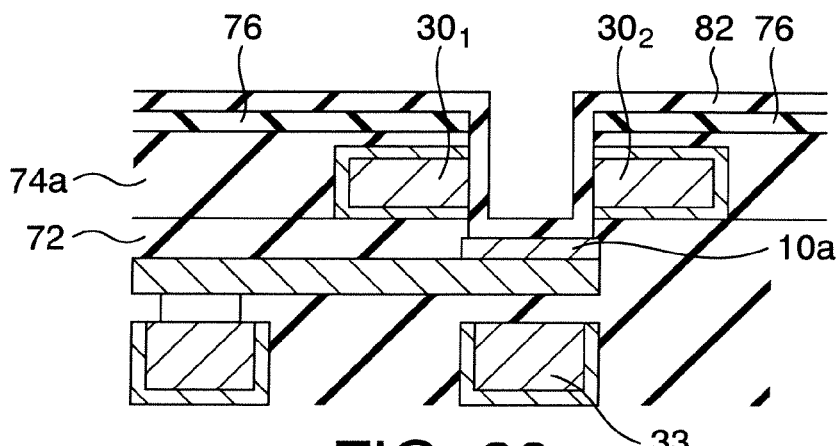
FIG. 20 is a sectional view showing a manufacturing step of the method of manufacturing the magnetic memory according to the tenth embodiment of the present invention.
Figure 21:
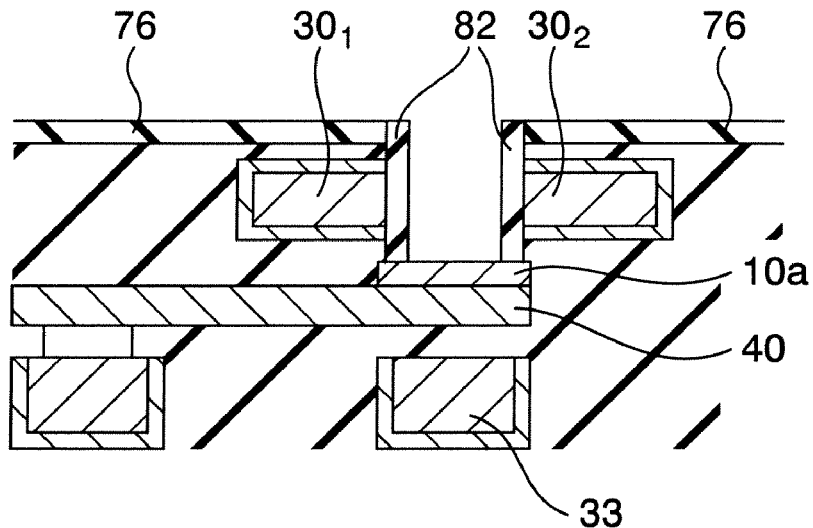
FIG. 21 is a sectional view showing a manufacturing step of the method of manufacturing the magnetic memory according to the tenth embodiment of the present invention.

As shown in FIG. 20, an SiOx film 82 is deposited by using a CVD (Chemical Vapor Deposition) method. Since the SiOx film 82 is deposited by the CVD method, the SiOx film 82 is formed on not only the bottom of the opening 80 having the inverted-taper section but also the side. Thereafter, a milling apparatus having good directivity is used to remove the SiOx on the SiNx film 76 and the SiOx on the bottom of the opening 80, thereby leaving the SiOx film 82 on only the side of the opening 80 (see FIG. 21).

Figure 22:
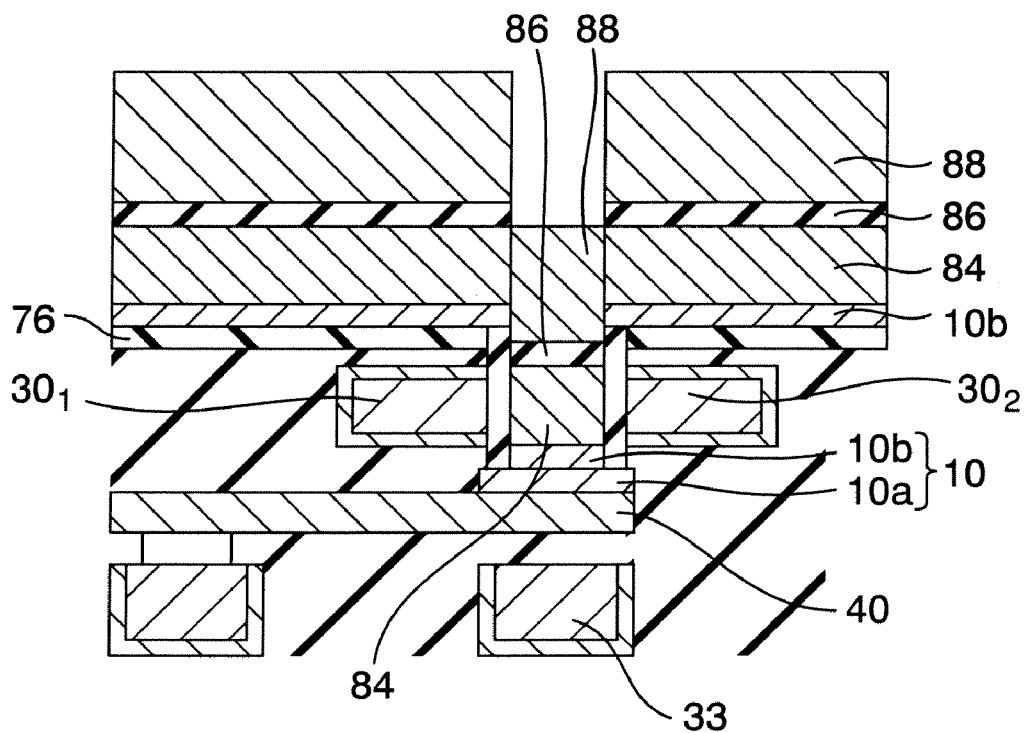
FIG. 22 is a sectional view showing a manufacturing step of the method of manufacturing the magnetic memory according to the tenth embodiment of the present invention.

A Ti layer 10b having a thickness of 10 nm, a Co—Cr—Pt layer 84 having a thickness of 80 nm, an AlOx layer 86 serving as a tunnel barrier layer and having a thickness of 1.5 nm, and a Co—Cr—Pt layer 88 having a thickness of 100 nm are formed (see FIG. 22). Since the opening 80 has an inverted-taper section, the Ti layer 10b, the Co—Cr—Pt layer 84, the AlOx layer 86, and the Co—Cr—Pt layer 88 are not laminated along the side of the opening 80, i.e., the side of the SiOx film 82, and are laminated along only the direction of the film thickness as shown in FIG. 22.

Figure 23:
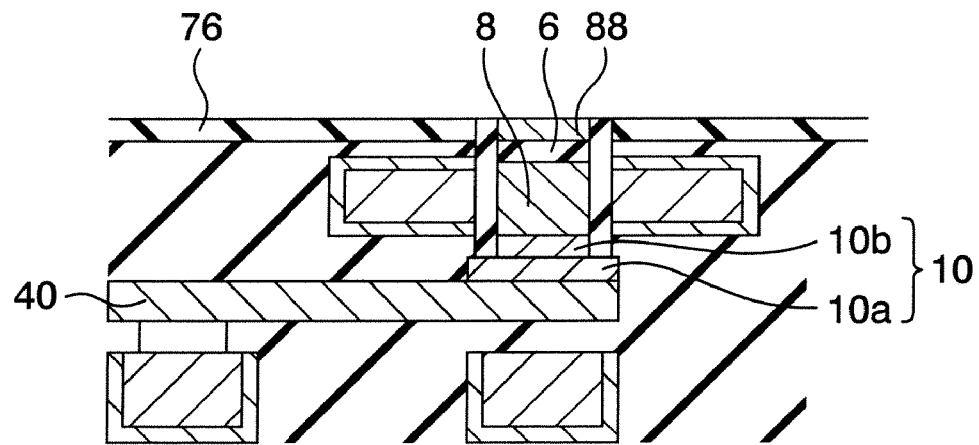
FIG. 23 is a sectional view showing a manufacturing step of the method of manufacturing the magnetic memory according to the tenth embodiment of the present invention.

CMP is performed to expose the SiOx film 72 (see FIG. 23). In this manner, the Ti layer 10b in the opening 80 constitutes the underlying layer 10 together with the Pt layer 10a. The Co—Cr—Pt layer 84 and the AlOx layer 86 in the opening 80 serve as the magnetization free layer 8 and the tunnel barrier layer 6, and the Co—Cr—Pt layer 88 is partially left on the tunnel barrier layer 6.

Figure 24:
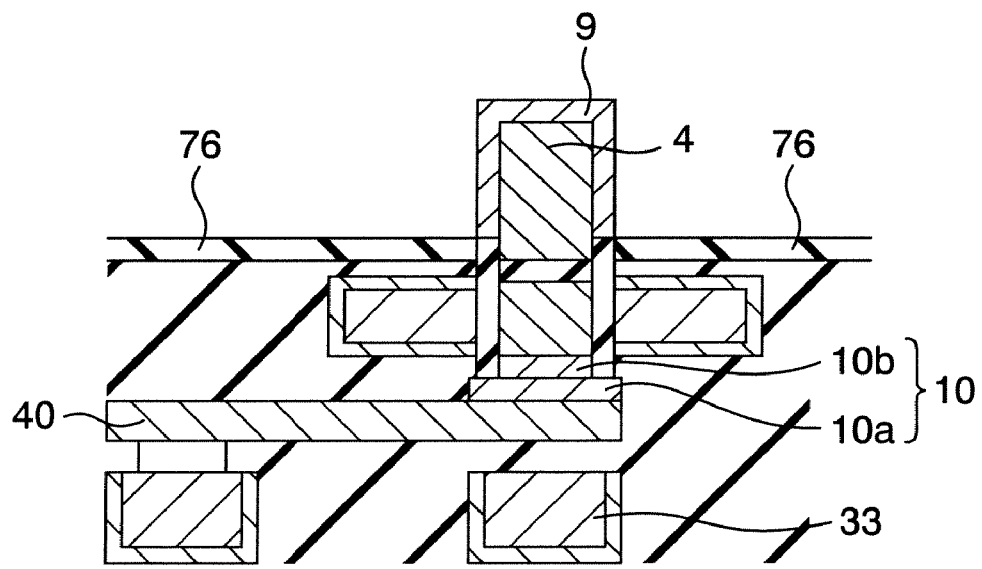
FIG. 24 is a sectional view showing a manufacturing step of the method of manufacturing the magnetic memory according to the tenth embodiment of the present invention.

Milling is performed to the resultant structure to slightly etch the surface of the structure. Thereafter, as shown in FIG. 24, a Co—Cr—Pt layer having a thickness of 100 nm and an Ir—Mn layer having a thickness of 20 nm are formed and patterned to form a magnetization-pinned layer 4 and to leave an Ir—Mn layer on the side surfaces of the magnetization-pinned layer 4. Thereafter, an Ir—Mn film is formed, and an Ir—Mn film is formed on the side surface of the magnetization-pinned layer 4. The Ir—Mn adhering a portion except for the magnetization-pinned layer 4 is etched by a milling apparatus having good directivity, and an anti-ferromagnetic film 9 consisting of Ir—Mn and covering the side surfaces and the upper surface of the magnetization-pinned layer 4 is formed (see FIG. 24).

Figure 25:
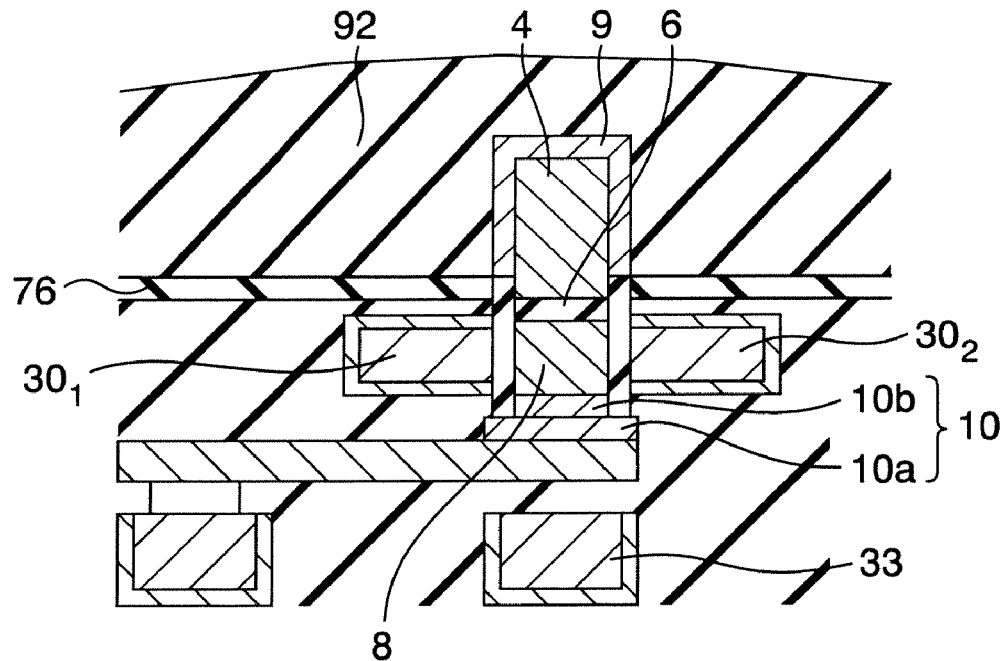
FIG. 25 is a sectional view showing a manufacturing step of the method of manufacturing the magnetic memory according to the tenth embodiment of the present invention.
Figure 26:
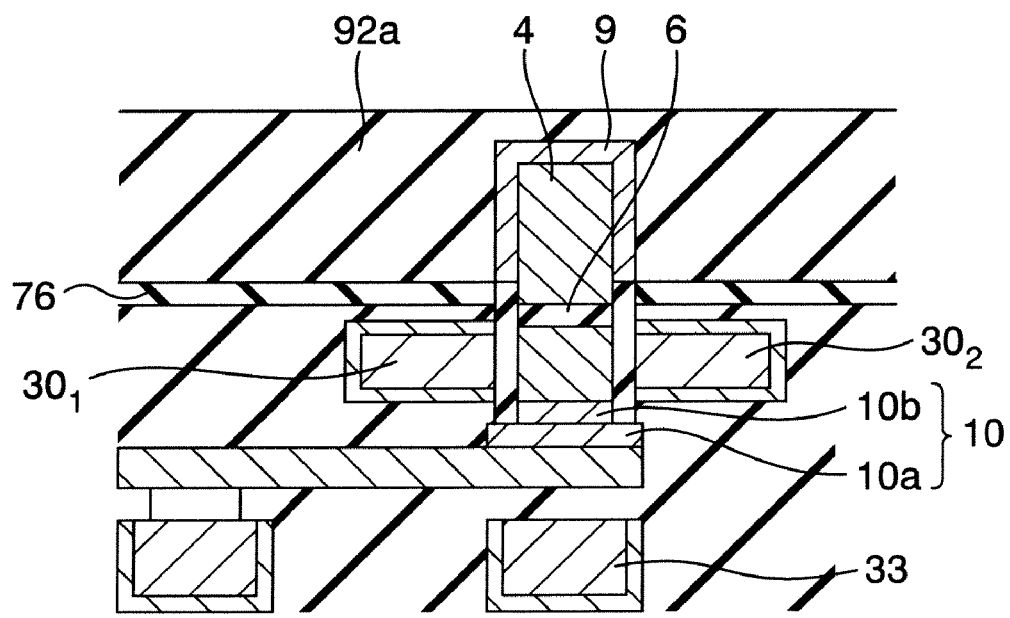
FIG. 26 is a sectional view showing a manufacturing step of the method of manufacturing the magnetic memory according to the tenth embodiment of the present invention.
Figure 27:
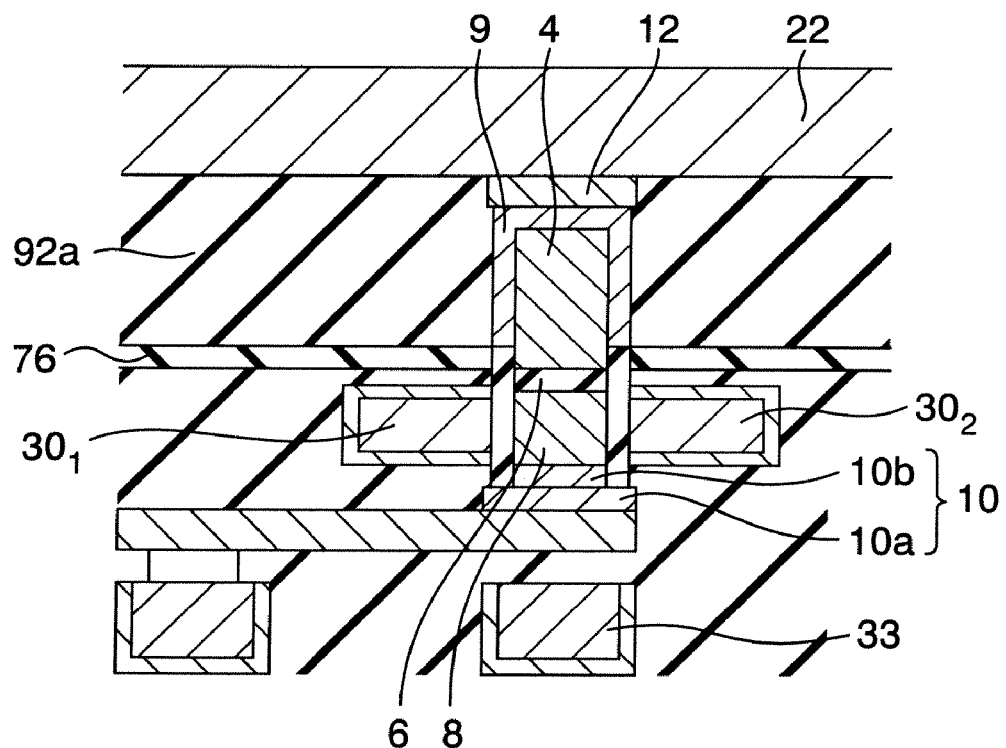
FIG. 27 is a sectional view showing a manufacturing step of the method of manufacturing the magnetic memory according to the tenth embodiment of the present invention.

An SiOx film 92 is deposited on the entire surface (see FIG. 25). Thereafter, the SiOx film 92 is flattened by using CMP to form a flattened SiOx film 92a.

A via hole connecting with the anti-ferromagnetic film 9 on the upper surface of the magnetization-pinned layer 4 is formed in the flattened SiOx film 92a, and W (tungsten) is buried in the via hole to form a conductive layer 12. Subsequently, the resultant structure is subjected to CMP, and Ti/AlCu/Ti films are sequentially formed and patterned to form a word line 22 connected to the conductive layer 12 (see FIG. 27).

In this manner, a magnetic memory is manufactured by the manufacturing method according to the embodiment. As a comparative example, a magnetic memory which was manufactured by the manufacturing method of the embodiment except that an anti-ferromagnetic film consisting of Ir—Mn is formed on the side surface of the magnetization-pinned layer 4 was formed.

In both the magnetic memory of the embodiment and the magnetic memory of the comparative example, an in-plane aspect ratio of TMR elements was set at 1:1, and a size was set at 0.4 μm×0.4 μm. An AlOx film 6 was formed such that an Al film was formed and then subjected to plasma oxidation.

Thereafter, in both the magnetic memory of the embodiment and the magnetic memory of the comparative example, a magnetic field was applied in a direction perpendicular to the film surface, and annealing was performed while applying the perpendicular magnetic field.

With respect to the magnetic memory of the embodiment and the magnetic memory of the comparative example, dependence of coercive force on the width of a write pulse magnetic field applied to the word lines $30_1$ and $30_2$ shown in FIG. 13 was measured, Ku·V/(K·T) was evaluated on the basis of Sharrock's equation (IEEE Trans. Magn. 26, 193 (1990). In this case, reference symbol Ku denotes an uniaxial magnetic anisotropy constant of the magnetization free layer 8 serving as a magnetic recording layer; V denotes the volume of the magnetization free layer 8; K denotes Boltzmann constant; and T denotes an absolute temperature.

In the magnetic memory of the embodiment and the magnetic memory of the comparative example, the volume V of the magnetization free layer 8 was given by 0.4 μm×0.4 μm×80 nm. However, the value of Ku·V/(K·T) was large, i.e., 3760. Even though the volume V was set at 0.09 μm×0.09 μm×80 nm, the value of Ku·V/(K·T) was considerably large, i.e., over 180. It was apparent that the magnetic memory had a tolerance to heat disturbances.

By using the structure of the embodiment, the recording layer having a film thickness of 80 nm can be easily formed while holding the magnetization of the magnetic recording layer perpendicular, and a heat disturbance stability parameter can be easily made large.

Figure 28:
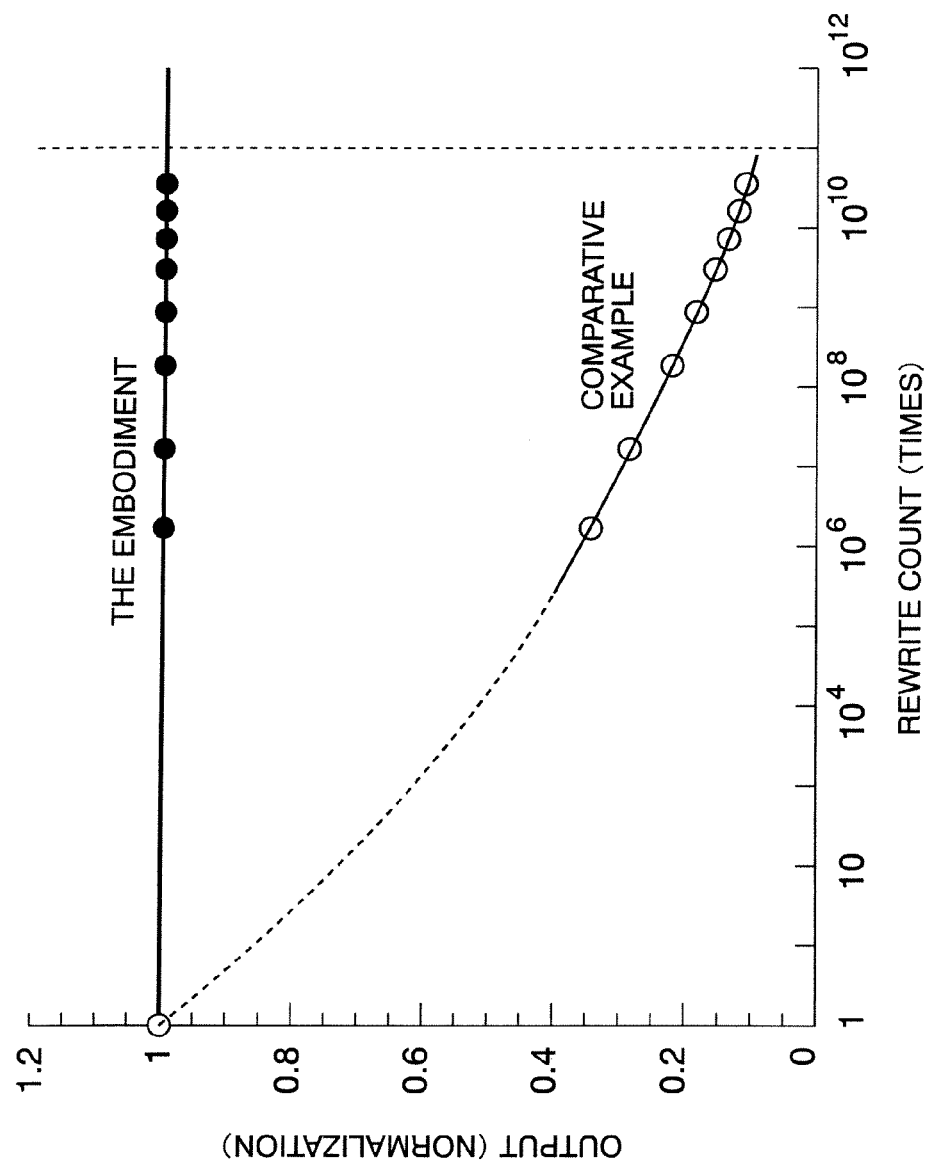
FIG. 28 is a graph showing the rewritable count tolerances of a magnetic memory manufactured by the manufacturing method according to the tenth embodiment of the present invention and a comparative example.

The magnetic memory of the embodiment and the magnetic memory of the comparative example were subjected to a reliability test of rewritable count resistance. The results are shown in FIG. 28. As is apparent from FIG. 28, in the magnetic memory of the embodiment, an MR ratio did not decrease even though data was written $10^9$ times. However, in the comparative example in which no anti-ferromagnetic film is formed on the side surfaces of the magnetization-pinned layer, an MR ratio decreased, and preferable characteristics cannot be achieved as the characteristics of the memory element.

As described above, in the magnetic memory of the embodiment, resistance to data storage and data write can be confirmed, and preferable characteristics can be achieved as the characteristics of a nonvolatile magnetic memory.

ELEVENTH EMBODIMENT

A magnetic memory according to an eleventh embodiment of the present invention will be described below. The magnetic memory manufactured by a manufacturing method according to the embodiment has a configuration obtained by replacing a magneto-resistive effect element of the magnetic memory manufactured by the manufacturing method of the tenth embodiment shown in FIGS. 15 to 27 with the magneto-resistive effect element shown in FIG. 6.

Therefore, the steps in manufacturing the magnetic memory of the embodiment are almost the same as the manufacturing steps of the tenth embodiment. However, in the magnetic memory of the eleventh embodiment, as shown in FIG. 6, the anti-ferromagnetic film 9 is not formed on the magnetization-pinned layer 4 constituted by the magnetization-pinned layer 4a, the nonmagnetic conductive layer 4b, and the hard bias layer 4c. For this reason, in the steps of forming the magnetization-pinned layer 4 and the anti-ferromagnetic film 9 shown in FIG. 24 of the tenth embodiment, the magnetization-pinned layer 4a, the nonmagnetic conductive layer 4b, and the hard bias layer 4c are formed (without forming an Ir—Mn film) in place of the magnetization-pinned layer 4 and the anti-ferromagnetic film 9 and patterned. Thereafter, an Ir—Mn film is formed. The resultant structure is milled with good directivity to physically remove the Ir—Mn layer on the upper side of the magnetization-pinned layer 4 constituted by the magnetization-pinned layer 4a, the nonmagnetic conductive layer 4b, and the hard bias layer 4c and the Ir—Mn layer on the SiNx film 76. The following steps are performed by the same manner as that of the tenth embodiment.

The structure of the TMR element manufactured in the embodiment includes a magnetization free layer 8 consisting of Fe—Pt and a thickness of 100 nm, a tunnel barrier layer 6 consisting of AlOx and having a thickness of 1.5 nm, a perpendicular magnetization layer 4a consisting of Fe—Pt and having a thickness of 100 nm, a conductive layer 4b consisting of Cu, and a hard bias layer 4c consisting of Co—Pt—Cr and having a thickness of 100 nm. As a film forming condition, a temperature during formation of an Fe—Pt film was set at 300° C. For the sake of comparison, a magnetic memory in which an Ir—Mn film was not formed on the side surface of the magnetization-pinned layer 4 was also formed.

In the magnetic memory of the embodiment and the magnetic memory of the comparative example, magnetic fields were applied in directions perpendicular to the film surfaces to perform annealing in the magnetic fields.

With respect to the magnetic memory of the embodiment and the magnetic memory of the comparative example, dependence of coercive force on the width of a write pulse magnetic field applied to the word lines $30_1$ and $30_2$ shown in FIG. 13 was measured, Ku·V/(K·T) was evaluated on the basis of Sharrock's equation (IEEE Trans. Magn. 26, 193 (1990). In this case, reference symbol Ku denotes an uniaxial magnetic anisotropy constant of the magnetization free layer 8 serving as a magnetic recording layer; V denotes the volume of the magnetization free layer 8; K denotes Boltzmann constant; and T denotes an absolute temperature.

In the magnetic memory of the embodiment and the magnetic memory of the comparative example, the volume V of the magnetization free layer 8 was given by 0.4 µm×0.4 µm×80 nm. However, the value of Ku·V/(K·T) was large, i.e., 4700. Even though the volume V was set at 0.09 µm×0.09 µm×80 nm, the value of Ku·V/(K·T) was considerably large, i.e., over 320. It was apparent that the magnetic memory had a tolerance to heat disturbances.

By using the structure of the embodiment, the recording layer having a film thickness of 100 nm can be easily formed while holding the magnetization of the magnetic recording layer perpendicular, and a heat disturbance stability parameter can be easily made large.

Figure 29:
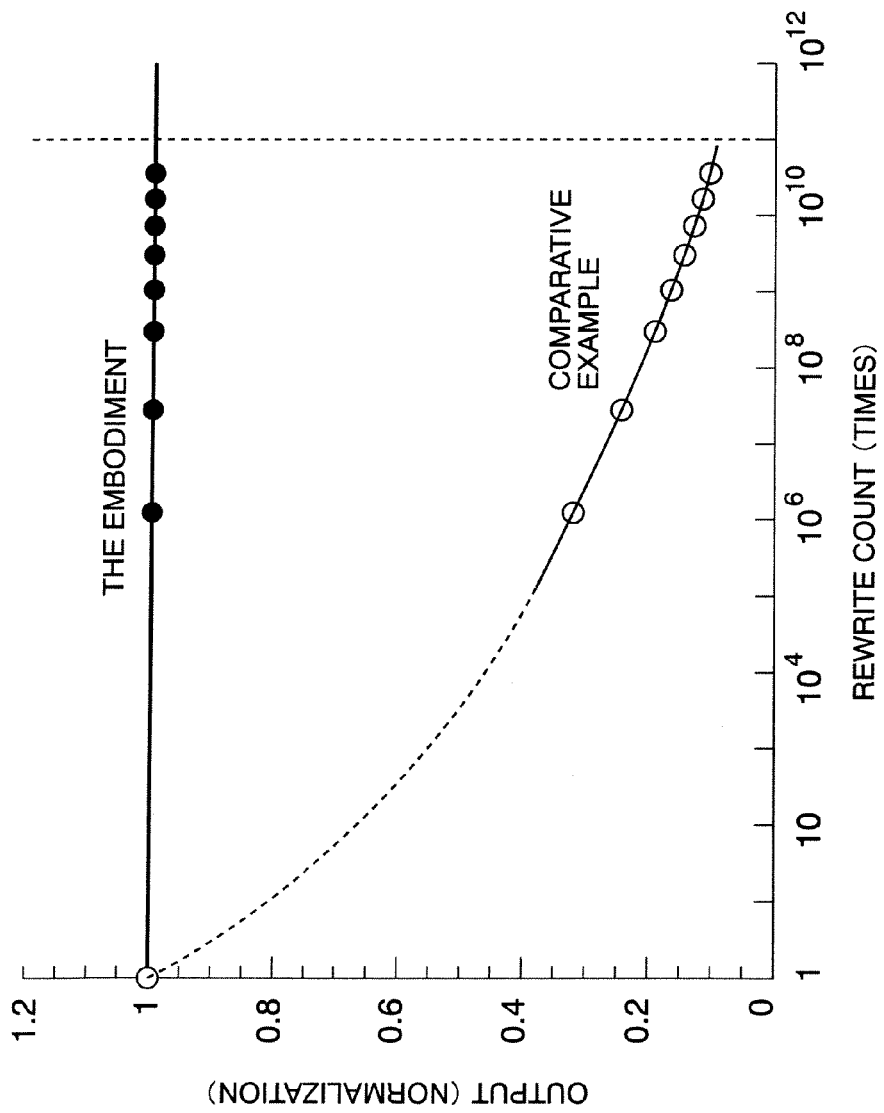
FIG. 29 is a graph showing the rewritable count tolerances of a magnetic memory according to an eleventh embodiment of the present invention and a comparative example and a comparative example.

The magnetic memory of the embodiment and the magnetic memory of the comparative example were subjected to a reliability test of rewritable count resistance. The results are shown in FIG. 29. As is apparent from FIG. 29, in the magnetic memory of the embodiment, an MR ratio did not decrease even though data was written $10^9$ times. However, in the comparative example in which no anti-ferromagnetic film is formed on the side surfaces of the magnetization-pinned layer, an MR ratio decreased, and preferable characteristics cannot be achieved as the characteristics of the memory element.

As described above, in the magnetic memory of the embodiment, resistance to data storage and data write can be confirmed, and preferable characteristics can be achieved as the characteristics of a nonvolatile magnetic memory.

TWELFTH EMBODIMENT

Figure 30:
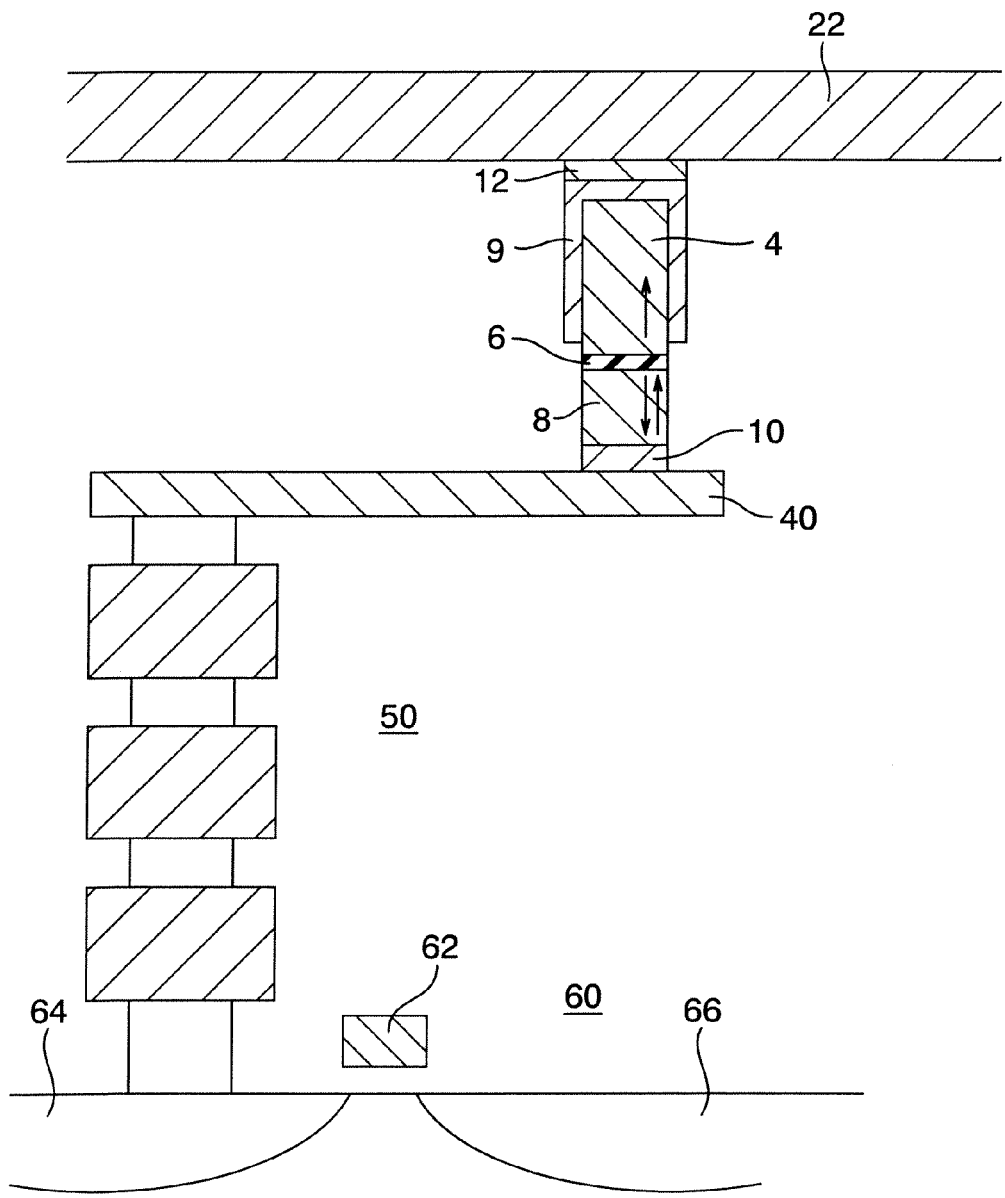
FIG. 30 is a sectional view showing a constitution of a magnetic memory according to a twelfth embodiment of the present invention.

A magnetic memory according to a twelfth embodiment of the present invention will be described below with reference to FIG. 30. FIG. 30 is a sectional view showing the configuration of the magnetic memory according to the embodiment. The magnetic memory according to the embodiment has a configuration obtained by removing the word lines $30_1$, $30_2$, and 33 and magnetic covering films $35_1$, $35_2$, and 36 covering these word lines in the magnetic memory according to the ninth embodiment shown in FIG. 13. In the magnetic memory according to the embodiment, information is written in a magnetization free layer 8 serving as a magnetic recording layer by a spin injection method. The write principle of the spin injection method is as follows.

a) Writing operation of spin inversion obtained by changing the spin moments of the magnetization-pinned layer 4 and the magnetic recording layer 8 from antiparallel to parallel is performed by flowing a current from the underlying electrode 40 to the word line 22 through the magneto-resistive effect element 2. More specifically, a current flows from the magnetic recording layer 8 to the magnetization-pinned layer 4 in the magneto-resistive effect element 2. When electrons are injected from the magnetization-pinned layer 4 into the magnetic recording layer 8, electrons spin-polarized by the magnetization-pinned layer 4 tunnel the tunnel barrier layer 6 to generate spin torque in the magnetic recording layer 8, and the spin of the magnetic recording layer 8 is inverted from antiparallel to parallel.

b) Writing operation of spin inversion obtained by changing the spin moments of the magnetization-pinned layer 4 and the magnetic recording layer 8 from parallel to antiparallel is performed by flowing a current from the word line 22 to the underlying electrode 40 through the magneto-resistive effect element 2. More specifically, a current flows from the magnetization-pinned layer 4 to the magnetic recording layer 8 in the magneto-resistive effect element 2. When electrons are injected from the magnetic recording layer 8 into the magnetization-pinned layer 4, electrons spin-polarized by the magnetic recording layer 8 tunnel the tunnel barrier layer 6. At this time, electrons having the same spin direction as the spin direction of the magnetization-pinned layer 4 have high tunnel probabilities and easily tunnel the tunnel barrier layer 6. However, electrons having antiparallel spin are reflected. The electrons reflected to the magnetic recording layer 8 generate spin torque in the magnetic recording layer 8, and the spin of the magnetic recording layer 8 is inverted from parallel to antiparallel.

A manufacturing procedure of a magnetic memory according to the embodiment is as follows.

An insulating interlayer is deposited on a substrate on which the selective transistor 60 is formed. An opening is formed in the insulating interlayer. The opening is buried with W (tungsten) to form a buried connection section 50. An underlying electrode 40 consisting of Ta is formed to be connected to the connection section. Thereafter, on the underlying electrode 40, an underlying layer 10 consisting of Ti and having a thickness of 10 nm, a magnetic recording layer 8 consisting of Co—Cr—Pt and having a thickness of 80 nm, a tunnel barrier layer consisting of AlOx and having a thickness of 1.0 nm, a magnetization-pinned layer 4 consisting of Co—Cr—Pt and having a thickness of 100 nm, an anti-ferromagnetic layer consisting of Ir—Mn and having a thickness of 20 nm, and a conductive layer 12 obtained by laminating an Ru layer having a thickness of 15 nm and a Ta layer having a thickness of 120 nm are formed. Thereafter, slimming of a resist (not shown) is performed at 140° for 10 minutes to form a resist pattern for a TMR element. As the resist pattern for the TMR element, a pattern having a size of 0.08 µm×0.14 µm is manufactured. By using the resist pattern as a mask, the conductive layer 12 having a laminated structure consisting of Ta and Ru is patterned by RIE. Thereafter, by using the patterned conductive layer 12 as a mask, a TMR film constituted by a Ti layer, a Co—Cr—Pt layer, an AlOx layer, a Co—Cr—Pt layer, and an Ir—Mn layer is patterned by milling up to the tunnel barrier layer 6 consisting of AlOx.

Thereafter, an anti-ferromagnetic film consisting of Ir—Mn is deposited and subjected to milling in a direction perpendicular to the film surface, so that the anti-ferromagnetic film 9 is formed on the side of the magnetization-pinned layer 4. Subsequently, a protective film consisting of an SiOx is formed, and the underlying electrode 40 consisting of Ta is etched by RIE. Thereafter, an insulating interlayer (not shown) consisting of SiOx is deposited and etched back to expose the Ta layer of the conductive layer 12. Subsequently, after contact cleaning of the exposed Ta layer is performed, a word line 22 connected to the Ta layer is formed, thereby manufacturing the magnetic memory according to the embodiment. Thereafter, a magnetic field is applied in the direction perpendicular to the film surface to perform annealing in the magnetic field.

With respect to the magnetic memory of the embodiment manufactured by the manufacturing method, dependence of coercive force on a sweep rate of a magnetic field was measured, Ku·V/(K·T) was evaluated on the basis of Sharrock's equation (IEEE Trans. Magn. 26, 193 (1990). In this case, reference symbol Ku denotes an uniaxial magnetic anisotropy constant of the magnetization free layer 8 serving as a magnetic recording layer; V denotes the volume of the magnetization free layer 8; K denotes Boltzmann constant; and T denotes an absolute temperature.

In the magnetic memory of the embodiment, the value of Ku·V/(K·T) was 320. Even though the volume V of the magnetization free layer 8 was set at 0.09 μm×0.09 μm×80 nm, the value of Ku·V/(K·T) was considerably large, i.e., over 180. It was apparent that the magnetic memory had a tolerance to heat disturbances. By using the structure of the embodiment, the recording layer having a film thickness of 80 nm can be easily formed while holding the magnetization of the magnetic recording layer perpendicular, and a heat disturbance stability parameter can be easily made large.

Figure 31:
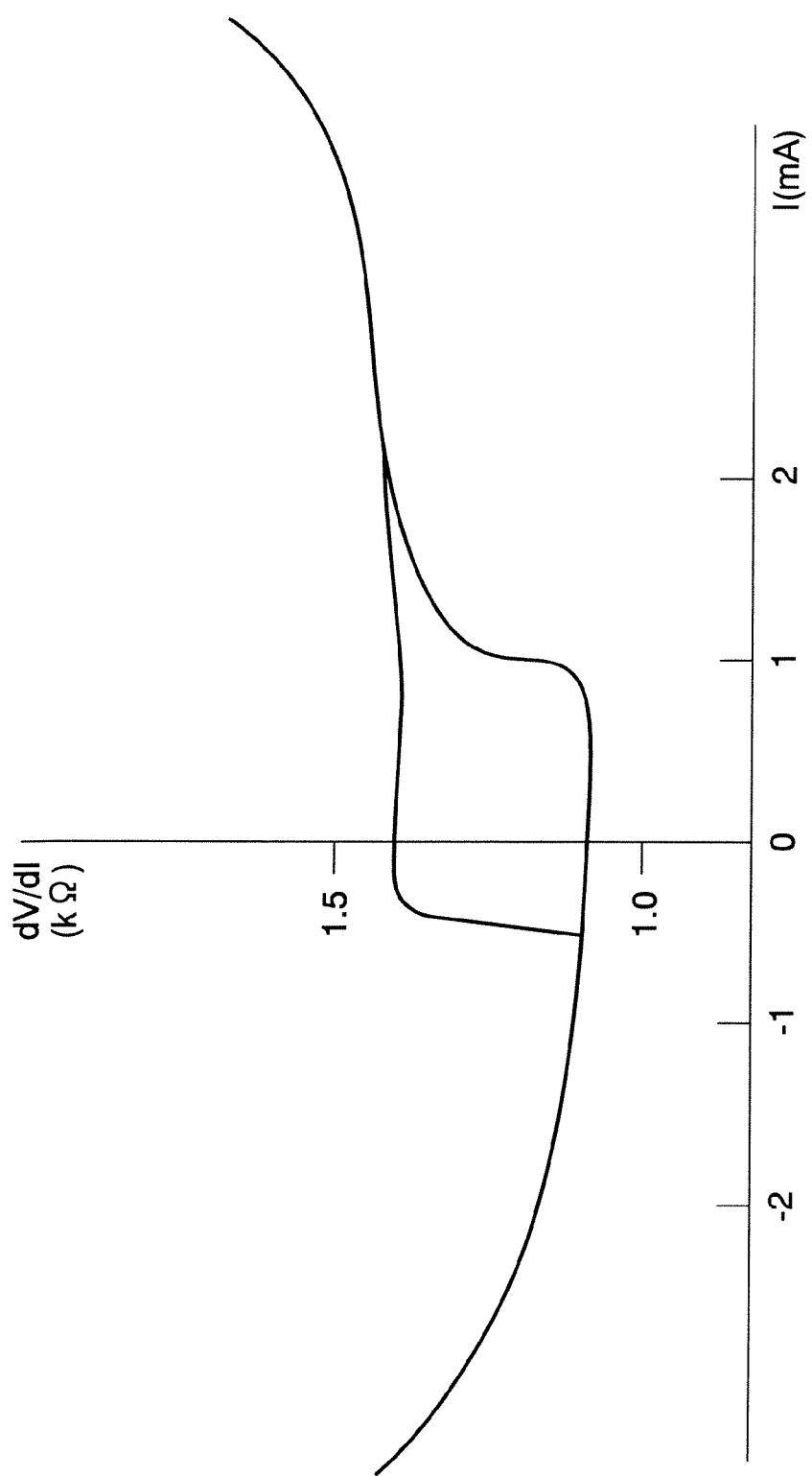
FIG. 31 is a graph showing a measurement result of writing by spin injection in the magnetic memory according to a twelfth embodiment of the present invention.

A result obtained by measuring spin injection writing operation is shown in FIG. 31. As is apparent from FIG. 31, spin injection writing operation can be performed by changing the direction of a current.

As described above, in the magnetic memory according to the embodiment, resistance to data storage and data write can be confirmed, and preferable characteristics can be achieved as the characteristics of a nonvolatile magnetic memory.

Each of the magnetic memories according to the ninth to twelfth embodiments further comprises a sense current control device circuit which controls a sense current to be flowed in the magneto-resistive effect element to read information stored in the magneto-resistive effect element, a circuit to apply a write pulse, and a driver.

In each of the embodiments, a tunnel barrier layer is used as a nonmagnetic layer between a magnetization-pinned layer and a magnetic recording layer of the magneto-resistive effect element. However, when the area of the magneto-resistive effect element is 300 nm² or less, as the material of the nonmagnetic layer, a nonmagnetic metal (for example, Cu, Cu alloy, or a mixture of Cu and a dielectric material (e.g., $SiO_2$, SiN, $Al_2O_3$, or the like)) can be used.

The embodiments of the present invention have been described with reference to the concrete examples. However, the present invention is not limited to the concrete examples. For example, the following is included in the spirit and scope of the present invention. That is, a person skilled in the art appropriately selects concrete materials of a ferromagnetic layer, an insulating film, an anti-ferromagnetic layer, a nonmagnetic metal layer, an electrode, and the like which constitute a magneto-resistive effect element, film thicknesses, shapes, and sizes to execute the present invention as described above, so that the same advantages as described above can be obtained.

Similarly, the following is also included in the spirit and scope of the present invention. That is, a person skilled in the art appropriately selects structures, materials, shapes, and sizes of elements constituting a magnetic memory according to the present invention to execute the present invention as described above, so that the same advantages as described above can be obtained.

According to the present invention, the magneto-resistive effect element of this patent is similarly applied to not only a magnetic head of a longitudinal magnetic recording scheme but also a magnetic head of a perpendicular magnetic recording scheme or a magnetic reproducing device, so that the advantages as described above can be obtained.

In addition, all magnetic memories which can be executed such that designs are appropriately changed by a person skilled in the art on the basis of the magnetic memory as the embodiment of the present invention are also included in the spirit and scope of the invention.

As described above, according to the present invention, excellent thermal stability can be achieved even though the magneto-resistive effect element is micropatterned, and stable magnetic domains of the magnetization-pinned layer can be kept even though switching of spin Additional advantages and modifications will readily occur to moments of the magnetization free layer is repeated. those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetic memory comprising at least a memory cell, the memory cell including a magneto-resistive effect element as a memory element, the magneto-resistive effect element including:
    a magnetization-pinned layer comprising a magnetic film having a first surface, a second surface opposite to the first surface, and third surfaces different from the first and second surfaces, the magnetic film having a spin moment oriented in a direction perpendicular to the first surface and pinned in the direction;
    a magnetic recording layer provided to face the first surface and having a spin moment oriented in a direction perpendicular to the first surface, a direction of the spin moment of the magnetic recording layer being parallel or antiparallel to that of the magnetization-pinned layer;
    a nonmagnetic layer formed between the magnetization-pinned layer and the magnetic recording layer; and
    an anti-ferromagnetic film formed on at least the third surfaces of the magnetization-pinned layer and being exchange-coupled to the magnetization-pinned layer so that the spin moment of the magnetic film is oriented in the direction perpendicular to the first surface.

2. The magnetic memory according to claim 1, wherein the nonmagnetic layer is a tunnel barrier layer.

3. The magnetic memory according to claim 1, comprising a nonmagnetic conductive layer formed on the second surface of the magnetic film.

4. The magnetic memory according to claim 1, wherein the magnetization-pinned layer further comprises a nonmagnetic conductive layer formed on the second surface of the magnetic film and a bias-applying magnetic layer formed on a surface of the nonmagnetic conductive layer opposite to the magnetic film.

5. The magnetic memory according to claim 1, wherein the anti-ferromagnetic film is also formed on the second surface of the magnetic film.

6. The magnetic memory according to claim 1, wherein the nonmagnetic layer is formed of nonmagnetic metal.

7. A magnetic memory comprising:
    a first wiring;
    a second wiring crossing the first wiring;
    a magneto-resistive effect element arranged in a crossing area between the first wiring and the second wiring, having one end electrically connected to the first wiring, and including a magnetization-pinned layer comprising a magnetic film having a first surface, a second surface opposite to the first surface, and third surfaces different from the first and second surfaces, the magnetic film having a spin moment oriented in a direction perpendicular to the first surface and pinned in the direction;
    a magnetic recording layer provided to face the first surface and having a spin moment oriented in a direction perpendicular to the first surface, a direction of the spin moment of the magnetic recording layer being parallel or antiparallel to that of the magnetization-pinned layer;

a nonmagnetic layer formed between the magnetization-pinned layer and the magnetic recording layer; and an anti-ferromagnetic film formed on at least the third surfaces of the magnetization-pinned layer and being exchange-coupled to the magnetization-pinned layer so that the spin moment of the magnetic film is oriented in the direction perpendicular to the first surface.

8. The magnetic memory according to claim 7, wherein the second wiring is a write wiring used to apply a current pulse for writing information to be recorded in the magnetic recording layer.

9. The magnetic memory according to claim 7, wherein the second wiring is electrically connected to the other end of the magneto-resistive effect element, and writing of the information to be recorded in the magnetic recording layer is performed by flowing a current between the first and second wirings and injecting spin-polarized electrons into the magnetic recording layer.

10. The magnetic memory according to claim 7, wherein the nonmagnetic layer is a tunnel barrier layer.

11. The magnetic memory according to claim 7, comprising a nonmagnetic conductive layer formed on the second surface of the magnetic film.

12. The magnetic memory according to claim 7, wherein the magnetization-pinned layer further comprises a nonmagnetic conductive layer formed on the second surface of the magnetic film and a bias-applying magnetic layer formed on a surface of the nonmagnetic conductive layer opposite to the magnetic film.

13. The magnetic memory according to claim 7, wherein the anti-ferromagnetic film is formed on the second surface of the magnetic film.

14. The magnetic memory according to claim 7, wherein the nonmagnetic layer is formed of nonmagnetic metal.

* * * * *